(12) United States Patent
Wegener

(10) Patent No.: US 7,486,205 B2
(45) Date of Patent: Feb. 3, 2009

(54) COMPRESSION AND DECOMPRESSION OF STIMULUS AND RESPONSE WAVEFORMS IN AUTOMATED TEST SYSTEMS

(75) Inventor: Albert W. Wegener, Portola Valley, CA (US)

(73) Assignee: Samplify Systems, Inc., Santa Clara, CA (US)

( * ) Notice: Subject to any disclaimer, the term of this patent is extended or adjusted under 35 U.S.C. 154(b) by 0 days.

(21) Appl. No.: 11/776,359

(22) Filed: Jul. 11, 2007

(65) Prior Publication Data

US 2008/0126903 A1 May 29, 2008

Related U.S. Application Data

(60) Provisional application No. 60/872,430, filed on Nov. 28, 2006.

(51) Int. Cl.
*H03M 7/00* (2006.01)
(52) U.S. Cl. .................................. 341/50; 714/732
(58) Field of Classification Search ................ 341/144, 341/155, 120, 67, 50, 58, 59; 714/732, 733
See application file for complete search history.

(56) References Cited

U.S. PATENT DOCUMENTS

| | | | |
|---|---|---|---|
| 5,828,577 A | | 10/1998 | Ehlig |
| 5,920,659 A | * | 7/1999 | Iverson et al. ............... 382/298 |
| 6,147,629 A | * | 11/2000 | Wood .......................... 341/67 |
| 6,782,501 B2 | | 8/2004 | Distler et al. |
| 7,071,852 B1 | | 7/2006 | Wegener |
| 7,093,174 B2 | | 8/2006 | Fenech Saint Genieys |
| 7,190,835 B2 | * | 3/2007 | Durbin et al. ............... 382/183 |
| 7,240,303 B1 | | 7/2007 | Schubert et al. |
| 2005/0154550 A1 | | 7/2005 | Singh et al. |

OTHER PUBLICATIONS

Wegener, pending U.S. Appl. No. 11/458,771, filed Jul. 20, 2006 for Enhanced Time-Interleaved A/D Conversion Using Compression.
Wegener, pending U.S. Appl. No. 11/553,147, filed Oct. 26, 2006 for Data Compression for a Waveform Data Analyzer.
PCT Notification of Transmittal of The International Search Report and The Written Opinion of the International Searching Authority, Jul. 18, 2008, 10 pages.

* cited by examiner

*Primary Examiner*—Peguy JeanPierre
(74) *Attorney, Agent, or Firm*—Haynes Beffel & Wolfeld LLP; Carolyn Koenig

(57) ABSTRACT

An automated test system for a device under test (DUT) compresses the stimulus waveform before transferring it to a storage device or over a data transfer interface. The compressed stimulus waveform data are decompressed, and if required converted to analog form, then applied as a stimulus to the DUT. In response, the DUT produces a response waveform. The response waveform is compressed before transferring it to a storage device or over a data transfer interface. If the response waveform is analog, it is converted to digital before compression. The compressed waveform is decompressed for further analysis or display by a host computer. Features of the response waveform can be calculated from the compressed or uncompressed waveform data. Several configurations that include compression and decompression of stimulus and/or response waveforms in test systems are described.

33 Claims, 21 Drawing Sheets

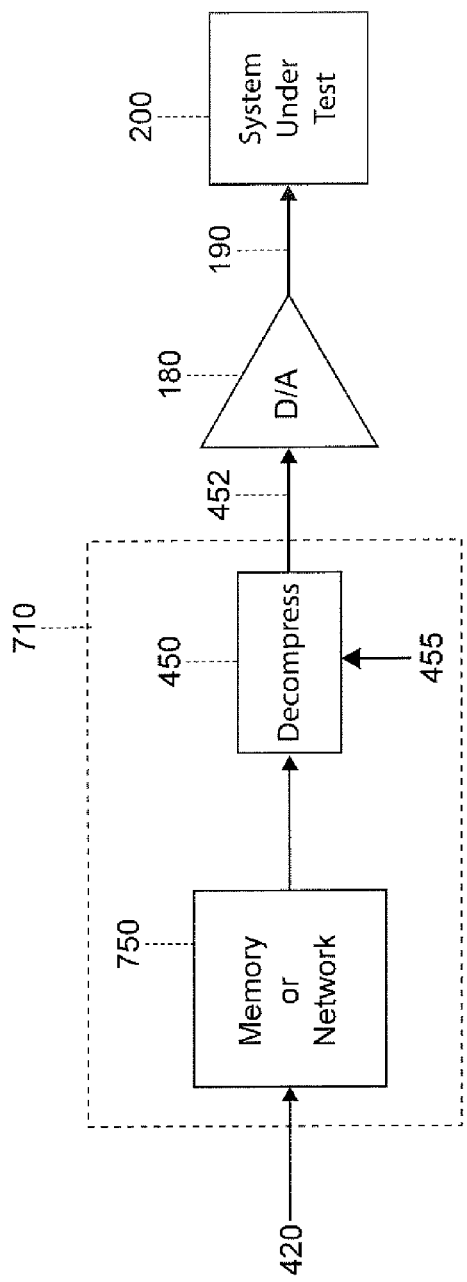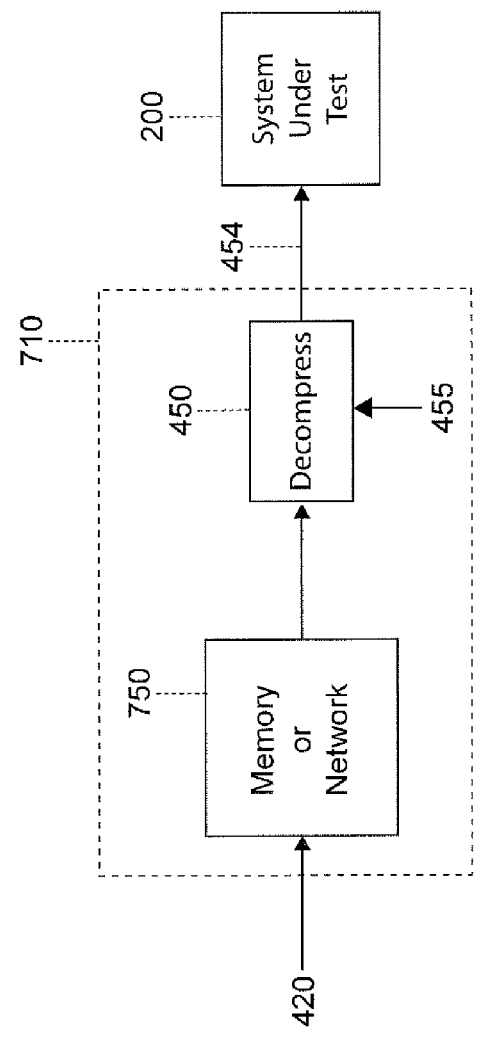

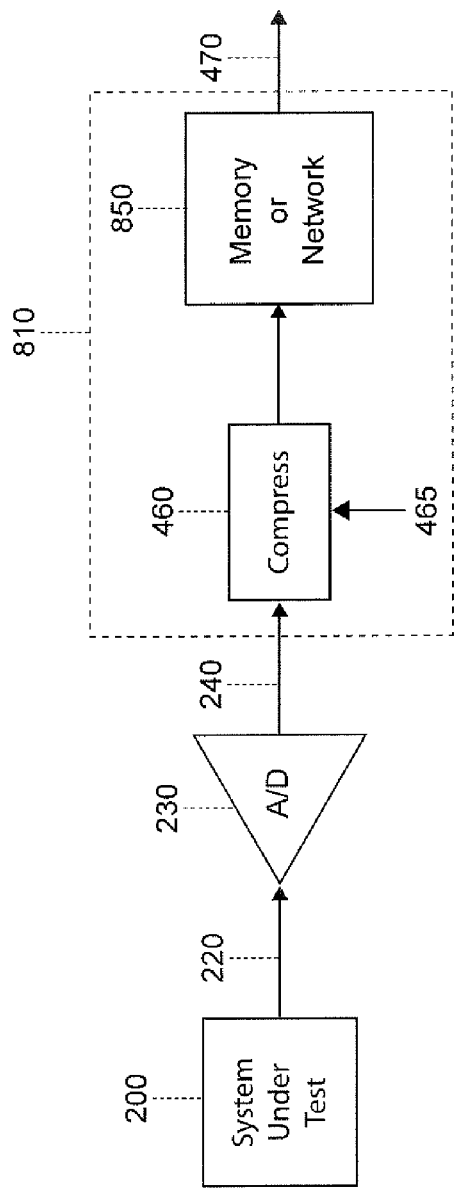
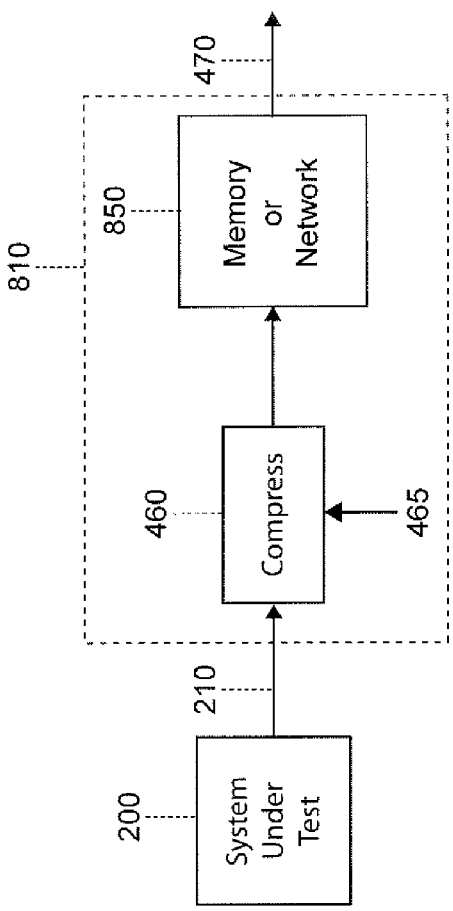
Figure 8a
Figure 8b

| Edge Pattern Index | Pattern Vectors | | | | | Edge Pattern Codes |
|---|---|---|---|---|---|---|
| 1 | -119 | -69 | 18 | 81 | 109 | 001 |
| 2 | -119 | -69 | 18 | 82 | 109 | 011 |
| 3 | -119 | -67 | 20 | 83 | 109 | 10 |
| 4 | -119 | -67 | 20 | 83 | 110 | 11 |
| 5 | -119 | -66 | 20 | 83 | 109 | 0100 |
| 58 | -75 | 12 | 79 | 108 |  | 000001 |
| 59 | -72 | 14 | 80 | 109 |  | 00011 |
| 60 | -72 | 15 | 80 | 109 |  | 00010 |
| 61 | -69 | 17 | 81 | 109 |  | 0101 |
| 62 | -69 | 17 | 82 | 109 |  | 10001 |

Figure 16a

New rising edge sample vector : ⟨ -119, -67, 0, 83, 109 ⟩
Closest edge pattern vector : ⟨ -119, -67, 4, 83, 110 ⟩
Edge error vector : ⟨ 0, 0, -1, 0, -1 ⟩
Edge pattern index : 4
Edge pattern code (Huffman) : 11

Figure 16b

Table A

| Exponent | Range of Error | Error | Mantissas Tokens |
|---|---|---|---|
| 0 | no error | --- | --- |
| 101 | 0 or +1 | 0, +1 | 0, 1 |
| 110 | 0 or −1 | 0, −1 | 0, 1 |
| 1001 | −1 to +1 | −1, 0, +1 | 11, 0, 10 |
| 1110 | −2 to +2 | −2, −1, 0, +1, +2 | 1111, 110, 0, 10, 1110 |

↗ A1 ↗ A2 ↗ A3 ↗ A4

Encoded Edge :  100  110, 0, 0, 1, 0, 1  ⟵ 1860

1860a    1860b    1860c

100 :  edge pattern index 4
   110 :  range of error 0 or −1
   0, 0, 1, 0, 1 :  encoded edge error samples
                    for edge error samples 0, 0, −1, 0, −1

Interpreted As :

Figure 17

COMPRESSION AND DECOMPRESSION OF STIMULUS AND RESPONSE WAVEFORMS IN AUTOMATED TEST SYSTEMS

BACKGROUND OF THE INVENTION

This invention relates to the generation, compression and decompression of stimulus waveforms and the capture, compression and decompression of response waveforms in automated test and measurement systems, especially systems that accept and/or generate electrical and/or optical signals.

In commonly owned U.S. Pat. No. 7,071,852 B1 ("the '852 patent"), entitled "Enhanced Test and Measurement Instruments Using Compression and Decompression," dated Jul. 4, 2006 and herein incorporated by reference, the present inventor discloses compression and decompression methods for test and measurement instruments, including arbitrary waveform generators (AWG) and digital storage oscilloscopes (DSO). In the commonly owned and copending U.S. patent application, application Ser. No. 11/458,771 (the '771 application) entitled, "Enhanced Time-Interleaved A/D Conversion Using Compression," filed on Jul. 20, 2006 and herein incorporated by reference, the present inventor describes compression of a bandlimited signal that is sampled by a parallel time-interleaved analog-to-digital converter (TIADC). The compression methods described therein are designed to take advantage of the parallel architecture of the TIADC. The compression methods of the '771 application can be implemented in a test and measurement system that includes a TIADC. In the commonly owned and copending U.S. patent application, Ser. No. 11/553,147 (the '147 application), entitled "Data Compression for a Waveform Data Analyzer", filed on 26 Oct. 2006 and herein incorporated by reference, the present inventor describes compression of waveform having recurring waveform states and teaches algorithms for this particular type of waveform.

It is a well known practice in the art to test electronic devices by applying a digital or an analog stimulus to the input of a system under test (SUT), device under test (DUT) or a circuit under test (CUT) and to analyze the response to determine proper operation. Using this methodology, automatic test equipment (ATE) systems test billions of integrated circuits (ICs), or "chips," each year, including mixed-signal and system-on-chip (SoC) devices. The stimulus and response methodology is used to test individual integrated circuits, printed circuit boards, systems, electronic products and the like. Regardless of the item being tested, the methodology of applying a stimulus to a SUT, DUT or CUT and observing the response is common practice in the test and measurement field. Depending on the system or device being tested, the stimulus and response signals can be electrical or optical. Because of the common stimulus and response methodology, the terms SUT, DUT and CUT are used interchangeably in the following discussion and are not intended to limit the scope to testing any particular circuit, device or system.

A desirable goal of automated test systems is to test a SUT as quickly as possible. Mixed-signal devices and SoC devices are increasingly used in high-volume, low-cost consumer electronics, such as in mobile phones, digital cameras and digital music players. As the prevalence of mixed-signal and SoC devices increases, so does the importance of testing these devices in an efficient, cost-effective manner.

Many SUTs have an analog input or an analog output. Testing these SUTs can require converting digital waveform samples to a corresponding analog stimulus waveform prior to stimulating the device or converting an analog response waveform from the device to a corresponding digital form. For this reason, many ATE systems include analog-to-digital converters (ADC) and digital-to-analog converters (DAC).

In many ATE systems, both stimulus and response signals are created, stored and manipulated in digital form. Stimulus signals are often stored in digital form in at least one stimulus memory. Storing stimulus waveforms provides flexibility to the testing process because the stimulus waveform can easily be created, retrieved, copied, moved, repeated, or reordered before being applied to the SUT. Similarly, response waveforms are often captured in digital form in at least one capture memory. When response waveforms are captured in digital form, they can easily be retrieved, measured, copied and transferred from one ATE subsystem to another.

It is common practice to implement stimulus and response memories using dynamic random access memory (DRAM) integrated circuits or DRAM modules, or using static random access memory (SRAM), or using flash memory (NOR or NAND flash). Stimulus and response memories can also be implemented using rotating media such as magnetic disk drives, CD-ROM drives, optical drives, DVD drives, and the like. The memory described herein applies to any form of data storage and is not limited to any particular physical implementation.

Stimulus and response memories can create bottlenecks in an ATE system because they have both limited capacity and limited access bandwidth. In particular, stimulus memory becomes a bottleneck when it cannot store all stimulus waveforms for a particular test or it cannot be accessed fast enough to accommodate the input data rate of the SUT. Similarly, response memory becomes a bottleneck when its access rate is too slow or its capacity is insufficient to capture the response waveform data from the SUT.

Other bottlenecks can arise as a result of the architecture of the ATE system. In many ATE systems the SUT is attached to one part of the test system called the "test head" and the overall control of the ATE system is performed by a controlling computer. Often, the controlling computer is the original source of stimulus waveforms and the ultimate destination of response waveforms. The limited bandwidth of the connection between the test head and the SUT limits the data transfer rate, creating an additional bottleneck. In the following discussion, an "instrument" refers to a printed circuit board or card in the test head.

In some ATE systems, the stimulus waveforms are generated by one or more arbitrary waveform generators (AWG) in the test head. An AWG generates an analog stimulus waveform by reading waveform samples from a memory and using a DAC to convert the samples to an analog stimulus waveform. The test head can also include one or more digitizers for capturing an analog response waveform. A digitizer converts the analog response waveform using an ADC and stores the response waveform samples in a memory.

The test head may include other instruments to generate digital stimulus patterns that are applied directly to the serial or parallel inputs of the DUT. For example, when testing a DAC, the ATE provides the digital stimulus waveform, such as DC levels, ramps, sawtooths, sine waves, etc., directly to the serial or parallel inputs of the DAC. The analog output of the DAC under test is captured by a digitizer and sampled as described above. Other response capture instruments in the test head can capture digital response waveforms directly from the DUT. For example, when testing an ADC, the ATE provides an analog stimulus waveform to the ADC. The ADC samples the analog stimulus waveform to provide digital response waveform samples on its serial or parallel outputs. The ATE response capture instrument stores the samples in a capture memory.

Emerging technologies in the field of IC test and measurement include built-in self test (BIST), design-for-manufacturability (DFM) and design-for-test (DFT). These emerging technologies address the problems of testing ICs with increasing complexity and on-chip clock rates substantially higher than chip interface rates by including stimulus generators and response capture circuitry within the IC itself. In BIST architectures, testing cores are integrated with the system to be tested to mitigate the limitations of the chip interface. The present invention is suitable for integration as an enhancement for stimulus generation, response capture, or both, and thus improves existing BIST, DFM, and DFT practices.

FIG. 1 is a block diagram showing an example of a typical test system from the prior art. A SUT 200 is stimulated with an analog stimulus waveform 190 or a digital stimulus waveform 160. The SUT 200 produces an analog response 220 and/or a digital response 210 that are captured for further processing. The host processor 100 coordinates the various operations required to perform the test. The host processor 100 can have any architecture appropriate for the test system, including mainframe, personal computer (PC), card-based and embedded. The host processor 100 provides at least one stimulus waveform to a stimulus memory 150 via a stimulus memory interface 120. When the test requires a digital stimulus, digital stimulus waveform 160 is retrieved from the stimulus memory 150 and provided to the digital input of SUT 200. When the test requires an analog stimulus, stimulus waveform samples retrieved from stimulus memory 150 are provided to the DAC 180 via DAC input 170. The DAC 180 converts the stimulus waveform samples into the analog stimulus waveform 190 at a given sample rate. The analog stimulus waveform 190 is applied to the analog input of SUT 200. A digital response waveform 210 output from the SUT 200 is captured in a response memory 250. An analog response waveform 220 from the SUT 200 is first digitized by the ADC 230 to produce a sampled response waveform 240 whose samples are stored in response memory 250. The samples in response memory 250 can be retrieved by host processor 100 via a response memory interface 270. The host processor 100 then performs further analysis, measurements, calculations, statistics-gathering and display operations.

FIG. 2 illustrates an example of a configuration for an ATE system from the prior art. Host processor 100, in this case a mainframe computer, is attached to test head 300 via a mainframe to test head interface 315. Mainframe to test head interface 315 can be implemented by a variety of technologies using electrical or optical cables, Ethernet (10/100/1000/10G-baseT variants) networks, USB cables, other parallel or serial cables, or busses such as PCI, PCI Express (PCIe), VME, VXI, PXI, etc. Test head 300 includes stimulus memory 150 and response memory 250. As described with respect to of FIG. 1, stimulus memory 150 provides digital stimulus waveform samples that are applied in a controlled sequence to the digital input of DUT 200. Alternatively, stimulus waveform samples from stimulus memory can be converted to an analog stimulus waveform by a DAC (not shown in FIG. 2) that is applied to the analog input of DUT 200. Similarly, response memory 250 stores the digital response waveform or a digitized version of the analog response waveform from DUT 200. Examples of commercially available ATE testers with this architecture include the Advantest T7611 and the Credence Sapphire D-40.

FIG. 3 is a block diagram of another configuration of a test system from the prior art. Host processor 100, in this case a personal computer, communicates with test chassis 330 using chassis interface 320. Test chassis 330 contains stimulus memory 150, whose output is used to stimulate the digital and/or analog inputs of SUT 200 via SUT interface 340. Similarly, the digital and/or analog outputs of SUT 200 are captured in response memory 250 via SUT interface 340. Examples of commercially available PC-based test systems include products from National Instruments. The National Instruments PXI test system includes multiple PXI (PCI eXtensions for Instrumentation) cards in a test chassis. The PC is implemented as a PXI card in the test chassis. The test chassis also contains a second PXI card that includes stimulus memory and a third PXI card that includes response memory. All PXI cards in test chassis can communicate using the chassis interface, also called a bus, interconnect, or backplane. National Instruments also offers a product where the test chassis is an instrumentation peripheral that uses the popular Universal Serial Bus (USB) to communicate with a laptop PC. In National Instruments compactDAQ™ product, the test chassis contains up to eight removable cards. One of the compactDAQ cards includes stimulus memory and a second compactDAQ card includes response memory. The test chassis communicates with the PC using a USB for the chassis interface. The compactDAQ card containing stimulus memory and the compactDAQ card containing response memory communicate with the SUT.

The prior art systems of FIGS. 1, 2 and 3 have the following limitations that reduce testing efficiency:
- Stimulus memory interfaces 120, 160 and 170 have limited bandwidths,
- Response memory interfaces 270, 210 and 240 have limited bandwidths,
- Mainframe to test head interface 315 and chassis interface 320 have limited bandwidths,
- Stimulus memory 150 and response memory 250 have limited storage capacities,
- Delays are incurred when host processor 100 transfers stimulus waveforms to stimulus memory 150 over interface 315 or 320 with limited bandwidths,
- Delays are incurred when host processor 100 retrieves the response waveform samples via interface 315 or 320 from response memory 250 prior to analysis.

The above limitations can be mitigated by compression and decompression to the stimulus waveforms and response waveforms in accordance with the present invention.

Faster testing enabled by the present invention can provide substantial cost savings in the production of ICs. The average cost per hour of testing by an ATE is $100 per hour. The cost savings can be economically significant for the nearly $250 billion worth of ICs sold annually. The cost of testing accounts for between 5% and 10%, conservatively, of the cost of silicon. An estimate of the cost of goods sold, including testing costs, is $100 billion, assuming a 60% gross margin. Based on this estimate, between $5 billion and $10 billion is expended for testing ICs annually. Reducing testing costs by 10% to 20% produces cost savings to the IC industry of $500 million to $2 billion.

The following example of IC testing illustrates how compression of the stimulus and response waveforms prior to transfer over a 1-gigabit Ethernet connection reduces testing time. In this example, a hypothetical mixed-signal IC test system requires a digital stimulus waveform and produces an analog response waveform. The stimulus waveform has 1 million samples, a sample rate of 1 gigasamples/sec. (Gsamp/sec.) and 8 bits per sample. Assume that the IC under test is stimulated for 1 msec., corresponding to the number of samples divided by the sample rate. The response waveform is captured for 1 msec. and digitized at a sample rate of 1 Gsamps./sec. to produce 1 million response waveform samples. Assume that applying compression described in the '147 application (also described below with respect to a preferred embodiment) to the stimulus and response waveform samples results in 2:1 lossless compression. The test system is an example of the architecture of FIG. 2, including a test head and a mainframe connected by a 1-gigabit Ethernet link. Data are exchanged between the test head and main frame at a rate of 125 megabytes/sec, or 125 megasamples/sec, via the Ethernet link. Four steps required to test the DUT are as follows:
1) Load the AWG in the test head with 1 million samples,
2) Generate the stimulus and capture the response in the test head for 1 msec.,
3) Transfer the response samples from the test head to the mainframe, and
4) Perform measurements in the mainframe.

The following table summarizes the testing times both with and without compression for the above steps:

| Test Step | Test Time without Compression | Test Time with Compresson |
|---|---|---|
| Load AWG memory in test head | 8 msec. | 4 msec. |
| Run test and capture response in digitizer memory in test head | 1 msec. | 1 msec. |
| Transfer response from test head to mainframe | 8 msec. | 4 msec. |
| Make measurements in mainframe | 8 msec. | 8 msec. |
| TOTAL | 25 msec. | 17 msec. |

The above table shows that total test time is reduced from 25 msec. to 17 msec., for a 30% reduction. For the average cost of testing by an ATE system of $100 per hour, 30% reduction in test time results in a savings of $30 per hour for this particular example.

Other related art for test systems describes compression and decompression of digital scan chains or scan vectors with an emphasis on detecting defects in components of a device. Scan chains and scan vectors can be generated using automatic test pattern generation (ATPG), which takes as input an IC netlist and generates a fault list. The related art does not address the use of compression and decompression in conjunction with stimulus waveforms and captured response waveforms, each having analog or digital forms. Examples that address compression of scan chains and scan vectors are described below. A significant distinction between the present invention's compression and scan chain compression is that scan chains are developed and used as sequences of individual '0' or '1' binary bits, while the present invention processes sequences of groups of N binary bits (not individual ones and zeros), where each N-bit value represents one sample in a sampled data waveform.

In patent U.S. Pat. No. 7,093,174 (the '174 patent) the compaction of scan chain patterns that are used to verify the functionality of individual flip-flops in a digital DUT is described. Scan chains are used to test strings of flip-flops (storage elements) in digital devices for proper operation. Using multiple scan chains, flip-flops and combinatorial logic in each subset of a semiconductor device can be tested. The organization of scan chains in digital devices is usually automatically determined by computer-aided design (CAD) tools. The goal of automated scan chain insertion by CAD tools is to efficiently determine whether flip-flops are operational. There is normally no relation between the functional operation of a DUT and the organization and access patterns of automatically or manually-generated scan chains. The '174 patent does not disclose the compression of digital waveforms that are later decompressed and applied to a DUT, in digital form or in analog form. The '174 patent does not disclose compressing the functional outputs of a DUT, including digital response waveforms or digitized versions of analog response waveforms, prior to storage in a response memory.

U.S. Pat. No. 6,782,501 (the '501 patent) describes compression of digital scan vectors that include long strings of two-valued logic levels, i.e. zeros and ones. The '501 patent cites the presence of "care" and "don't care" bits in the digital scan vectors (stimulus) to be compressed. The scan vectors do not represent digital waveforms that have multiple amplitude values. The '501 patent describes the generation of highly compact "signatures" (16-bit or 32-bit values) from the ones and zeros in the response signal. The "signature" of a response signal is generated through a series of logical and/or arithmetic operations that determine whether the signature of one scan chain is identical to the signature of another scan chain. The "signatures" do not preserve or encode the individual response bits. These "signatures" are used for error detection, just as are cyclic redundancy checks (CRC), error-detecting codes (EDC) and parity codes. The "signatures" do not represent the samples of a digital waveform or analog waveform and cannot be used to reconstruct the entire stream of bits from which the signature was generated. The '501 patent does not disclose reversible compression of stimulus and response waveforms.

In addition to the limitations described above, the related art has additional disadvantages:
the time taken to write uncompressed stimulus waveform samples into a stimulus memory is directly related to the number of uncompressed samples in the stimulus waveform,
the time taken to read uncompressed waveform samples from a response memory is directly related to the number of uncompressed samples in the response waveform,
response capture devices usually do not make measurements, but instead are only capable of capturing waveforms, whose characteristics are later measured by a remote measurement system, such as a computer or ATE mainframe.

SUMMARY OF THE INVENTION

An object of the present invention is to increase efficiency of test and measurement systems by compressing stimulus waveform and response waveforms before they are transferred over interfaces.

Another object of the present invention is to compress a stimulus waveform before it is transferred over a data transfer interface or to a storage device. To generate a stimulus waveform, the compressed stimulus waveform data are retrieved, decompressed and provided to the SUT as a digital stimulus or as an analog stimulus after analog-to-digital conversion.

Another object of the invention is to compress a response waveform from a SUT so that compressed response waveform data are transferred over a data transfer interface and/or to a storage device. The compressed response waveform data are then decompressed for further analysis or display.

Another object of the invention is to measure features, or parameters, of the response waveform by analyzing the uncompressed response waveform, the compressed response waveform data or the decompressed response waveform. The feature data can be provided in addition to or instead of the compressed response waveform data.

Another object of the present invention is to provide alternative configurations for test systems that include a stimulus decompressor in one configuration, a test system includes a stimulus source device that includes the stimulus decompressor and provides the decompressed stimulus waveform to the DUT. In another configuration, the stimulus decompressor the DUT are integrated in a self-testing system.

Another object of the present invention is to provide alternative configurations for test systems including the response compressor. In one configuration, the test system includes a response processor device that includes the response compressor. The response processor receives and compresses the response waveform from the DUT before transferring it to a data storage device or a data transfer interface. In another configuration, the response compressor the DUT are integrated in a self-testing system.

In another object of the invention, a remote host processor, such as a PC or mainframe, compresses one or more stimulus waveforms and stores the compressed stimulus waveform data in the stimulus memory. The remote host processor also retrieves the compressed response waveform data from the response memory and then decompresses the compressed response waveform data. The remote host processor may optionally make measurements or gather statistics that characterize the response waveform.

An advantage of the present invention is reduced testing time for the DUT because the time required for transfer of stimulus waveforms and response waveforms is decreased. The compressed waveform data will have the effect of transferring more waveforms to and from the DUT over the interfaces with limited bandwidths during a given time period.

Another advantage of the present invention is, in effect, storing an increased number of stimulus waveforms and response waveforms in stimulus and response memories, respectively, because the waveforms are compressed. Alternatively, the amount of memory required may be reduced along with a correspondingly reduced memory cost.

BRIEF DESCRIPTION OF THE DRAWINGS

FIG. 7a is a block diagram of a stimulus source with a decompressor for an analog stimulus, in accordance with a preferred embodiment.

FIG. 7b is a block diagram of a stimulus source with a decompressor for a digital stimulus, in accordance with a preferred embodiment.

FIG. 8a is a block diagram of a response processor with a compressor for a sampled response waveform, in accordance with a preferred embodiment.

FIG. 8b is a block diagram of a response processor with a compressor for a digital response waveform, in accordance with a preferred embodiment.

FIGS. 16a and 16b give an example of edge encoding, in accordance with a preferred embodiment.

FIG. 17 gives an example of edge error encoding by a compressor, in accordance with a preferred embodiment.

DETAILED DESCRIPTION

The use of compression and decompression in a test system to reduce test time, increase memory capacity and increase memory bandwidth is described in the following.

Figure 4:
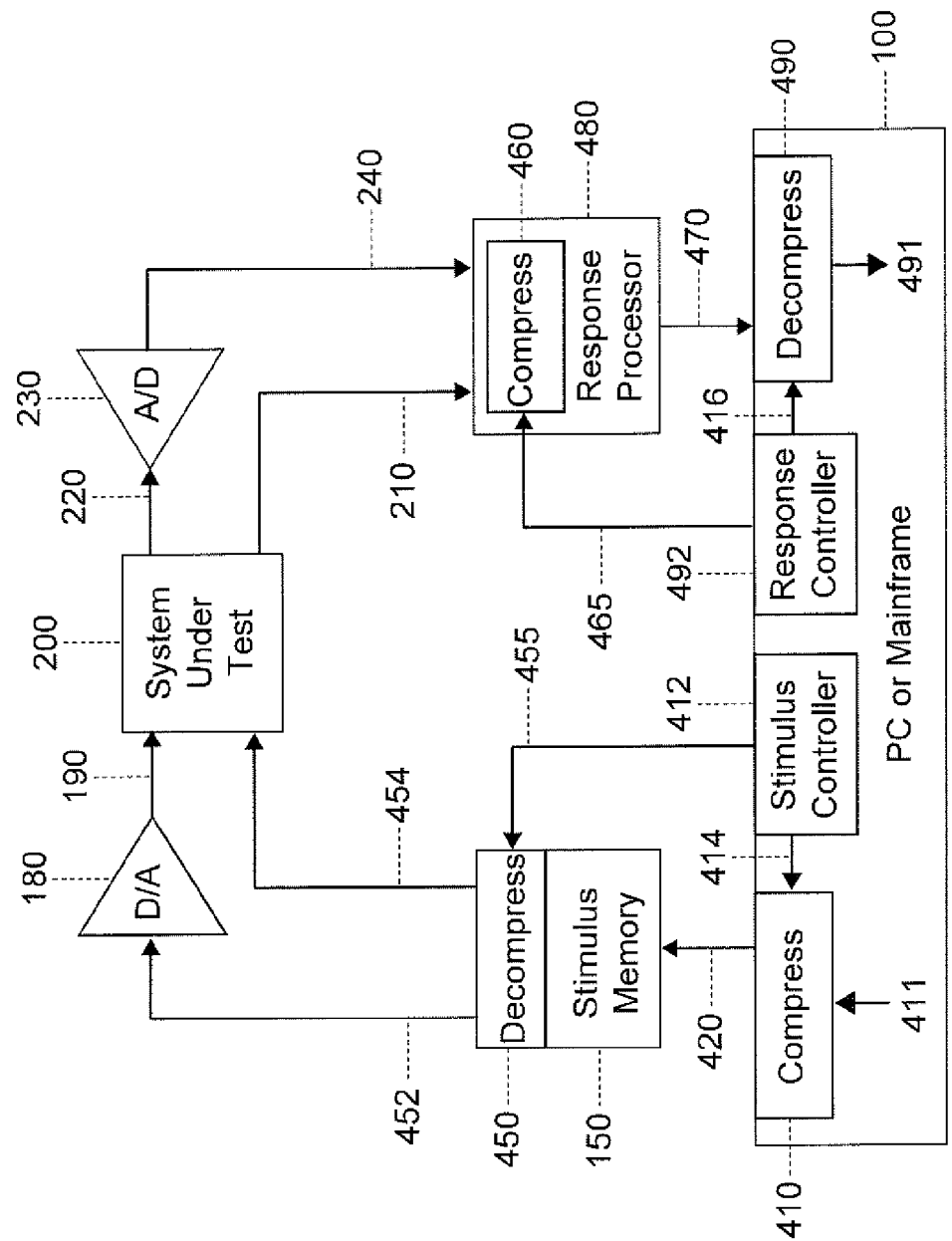
FIG. 4 is a block diagram of use of compression and decompression for both stimulus and response waveforms in a test system, in accordance with a preferred embodiment.

FIG. 4 is a block diagram of a preferred embodiment of a test system that includes compression and decompression of stimulus and response waveforms. The host processor 100, in this embodiment, is a PC or mainframe and is the source of the stimulus waveform samples 411. Stimulus compressor 410 compresses stimulus waveform samples 411 to produce compressed stimulus waveform data 420. An optional stimulus controller 412 may control stimulus compressor 410 via stimulus compression control 414 to provide control of the compression mode, further described below. The compressed stimulus waveform data 420 can be stored in stimulus memory 150. To generate a stimulus waveform for the SUT 200, the compressed stimulus waveform data are retrieved from memory 150 and decompressed by the stimulus decompressor 450. For a digital stimulus, the decompressed stimulus waveform 454 from the stimulus decompressor 450 is provided directly as the digital stimulus waveform to the system under test 200. For an analog stimulus, the decompressed stimulus waveform 452 is converted to analog by the DAC 180. The DAC provides the analog stimulus waveform 190 to the system under test 200.

The SUT 200 produces one or more output response waveforms, each of which can be analog or digital. An analog response waveform 220 is converted by ADC 230 to form a sampled response waveform 240 that is provided to response processor 480. A digital response waveform 210 is provided directly to response processor 480. The response processor 480 compresses and, optionally, measures features of the response waveforms. Feature measurements will be described below with respect to FIGS. 9a, 9b, 10a, 10b and 17. The response compressor 460 compresses sampled response waveform 240 and/or digital response waveform 210 to produce compressed response waveform data 470. The optional response controller 492 selects lossless and lossy compression modes and compression parameters. The response controller 492 provides response compression control 465 and to response compressor 460. The response decompressor 490 decompresses the compressed response waveform data 470 to form a decompressed response waveform 491 for further analysis by the host processor 100. The optional response controller 492 can control the operations of response decompressor 490 via response decompression control 416.

The stimulus controller 412 and response controller 492 can provide selection of compression mode and respond to input from a user. The compression modes for stimulus compressor 410 and response compressor 460 include lossless modes and lossy modes. For example, under some circumstances stimulus compressor 410 will generate lossless-compressed waveforms, whose values after decompression by stimulus decompressor 450 will be identical to the original stimulus waveform. In other circumstances, stimulus compressor 410 will generate lossy-compressed waveforms that require less storage and/or bandwidth than either the lossless-compressed waveform or the original, uncompressed waveform. In the case of lossy compression, several additional alternatives are available. Lossy compression may provide a compressed waveform whose bandwidth or bit rate is user-specified. In other instances lossy compression may provide a compressed waveform whose quality is user-specified. For lossy compression modes, parameters representing the desired the bit rate (including compression ratio) or signal quality (including signal-to-noise ratio [SNR], distortion level, etc.) may be passed to stimulus compressor 410, via stimulus compression control 414 and, optionally, to stimulus decompressor 450 via stimulus decompression control 455. Response controller 492 provides similar compression control for the response compressor 460. In addition, response controller 492 can select any features measurements that will be generated by further processing the response waveform data.

Figure 1:
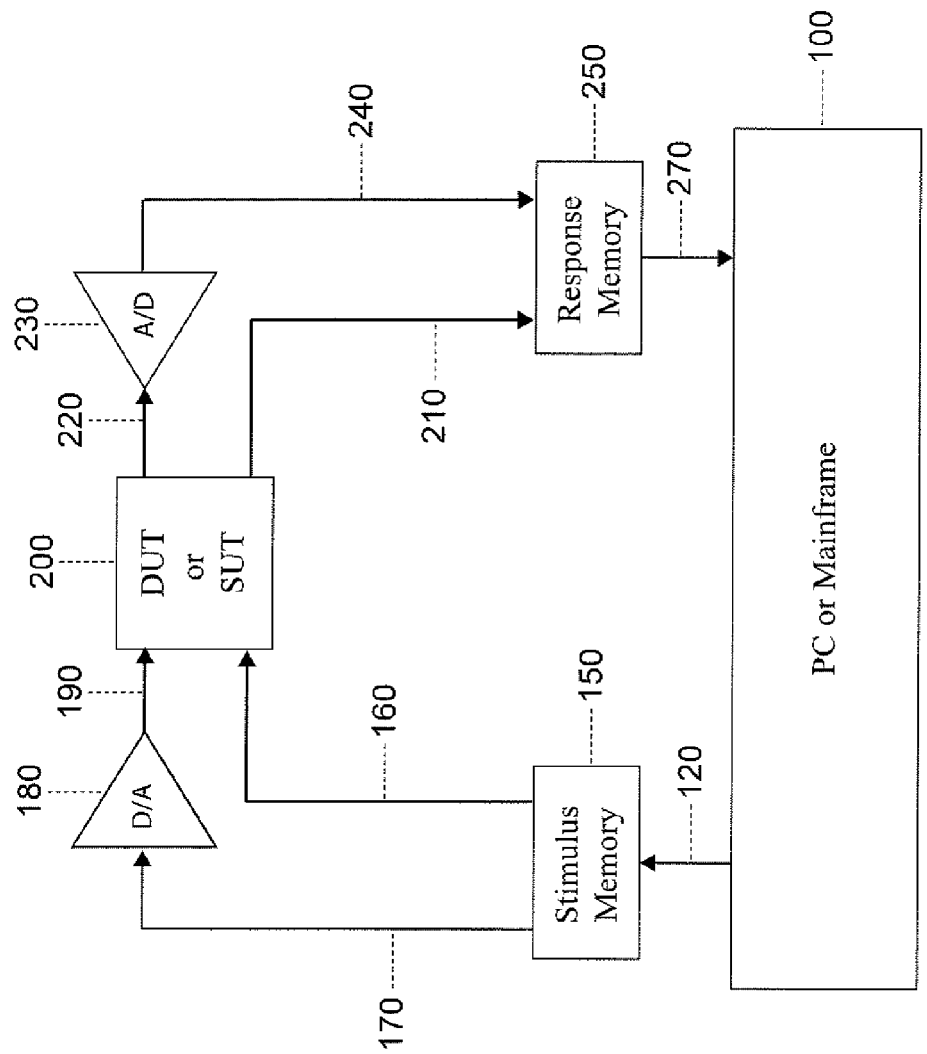
FIG. 1 is a block diagram of a stimulus and response test system, illustrated as testing a system under test (SUT) or a device under test (DUT), in accordance with the prior art.
Figure 2:
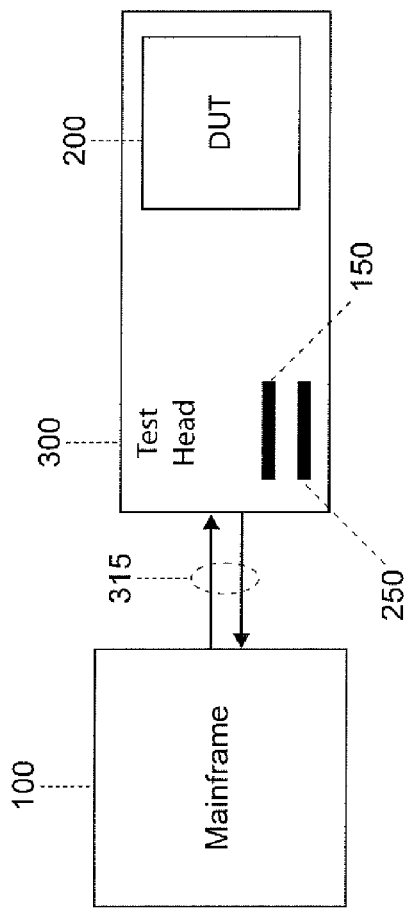
FIG. 2 is a block diagram of a configuration example of automatic test equipment (ATE), in accordance with the prior art.
Figure 3:
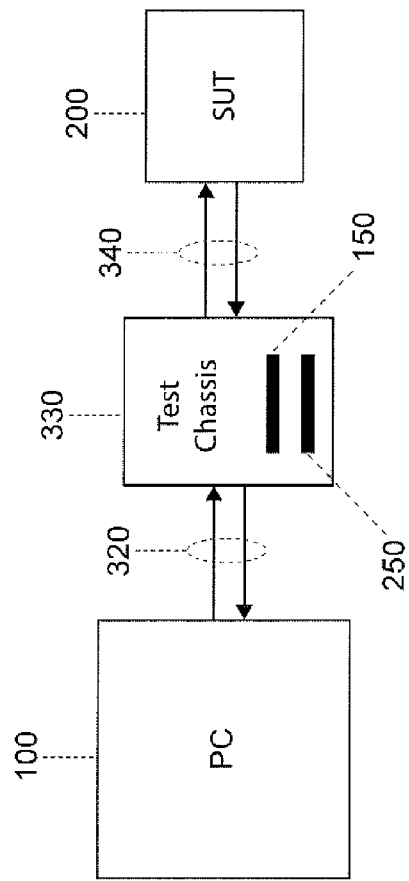
FIG. 3 is a block diagram of another configuration example of automatic test equipment (ATE), in accordance with the prior art.

In this description, the host processor 100 functions as the source of the original stimulus waveform samples 411 to be compressed or the destination for the response waveform data, compressed, decompressed or uncompressed, depending on the application. Host processor 100 can make measurements on the response waveform data appropriate for the application. Host processor 100 can be implemented by one or more processors in a PC or mainframe, as indicated by FIGS. 1-6. Host processor 100 can also be implemented in alternative locations. Referring to FIG. 2, host processor 100 can be implemented on a separate controller card in the test head 300 or a CPU integrated with stimulus memory 150 and/or response memory 350. Referring to FIG. 3, host processor 100 can be implemented in a separate controller card in test chassis 330 coupled to stimulus memory 150 and/or response memory 350.

Figure 5:
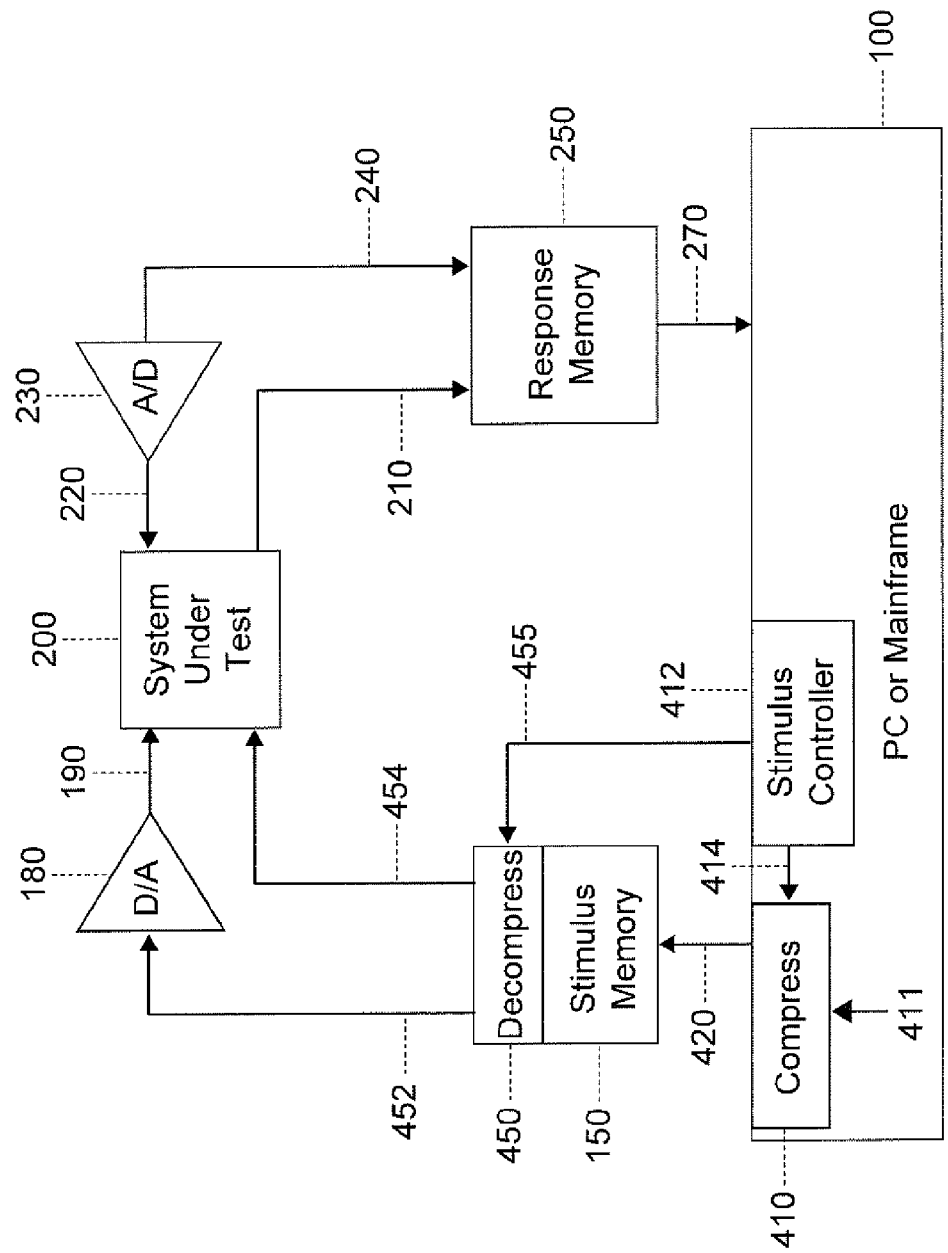
FIG. 5 is a block diagram of an enhanced test system using compression and decompression for stimulus waveforms, in accordance with a preferred embodiment.

FIG. 5 is a block diagram of an embodiment wherein only the stimulus waveform is compressed and decompressed. Stimulus compressor 410 stimulus decompressor 450 and optional stimulus controller 412 are the same as described with respect to FIG. 4. Unlike the embodiment of FIG. 4 the response waveform is not compressed or decompressed, but is stored in response memory 250 as described previously for the prior art test system of FIG. 1.

Figure 6:
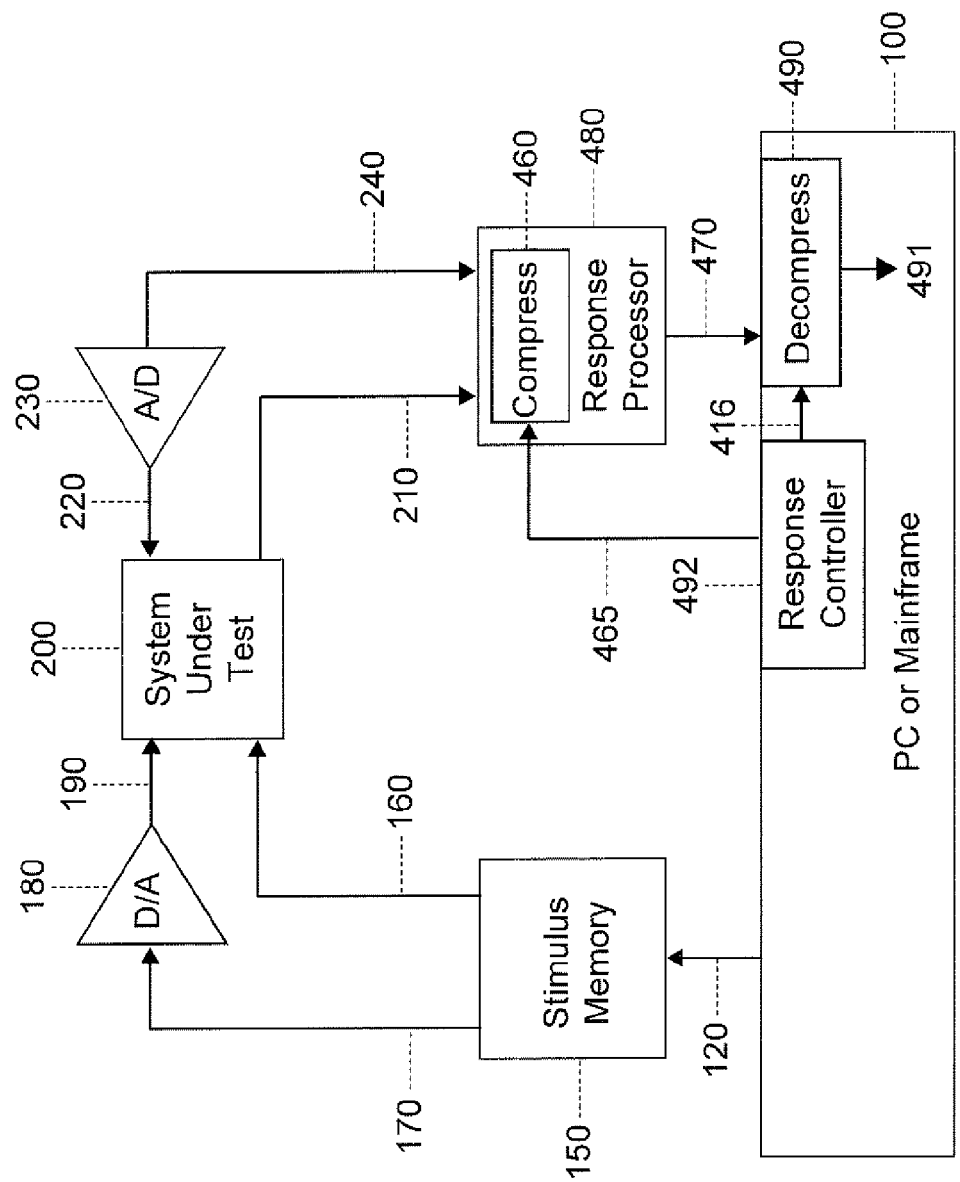
FIG. 6 is a block diagram of an enhanced test system using compression and decompression for response waveforms, in accordance with a preferred embodiment.

FIG. 6 is a block diagram of an embodiment wherein only the response waveform is compressed and decompressed. The response processor 480, response compressor 460, response decompressor 490 and optional response controller 492 are the same as described with respect to FIG. 4. The input stimulus waveform is stored in uncompressed form in the stimulus memory 150, as described for the prior art test system of FIG. 1.

Figure 7C:
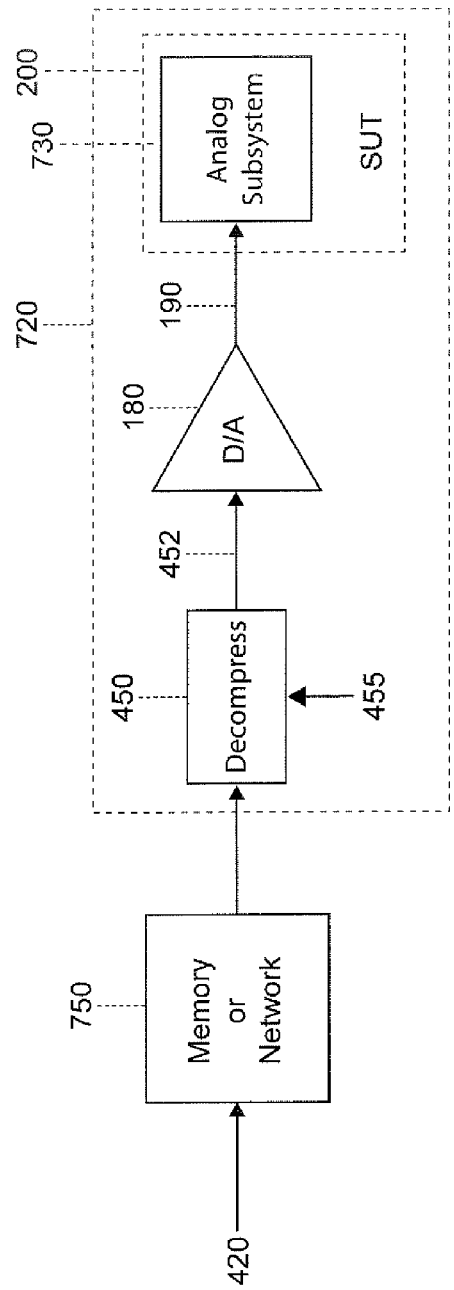
FIG. 7c is a block diagram of a self-testing system with an integrated decompressor and DAC, in accordance with a preferred embodiment.

FIGS. 7a-d shows various possible configurations for compressing and decompressing the stimulus waveform. FIG. 7a is a block diagram of an embodiment providing an analog stimulus where the compressed stimulus waveform data 420 is transferred from the stimulus compressor 410 to a stimulus source 710. The stimulus source 710 includes a stimulus memory or network 750 that transfers and/or stores the compressed stimulus waveform data 420. The stimulus decompressor 450 retrieves the compressed stimulus waveform data 420 from the memory or network 750 and produces decompressed stimulus waveform 452. The DAC 180 converts the decompressed stimulus waveform 452 to produce an analog stimulus waveform 190 for the SUT 200.

FIG. 7b is a block diagram of an embodiment providing a digital stimulus where the compressed stimulus waveform data 420 is transferred to the stimulus source 710 as described for FIG. 7a. The stimulus decompressor 450 provides the decompressed stimulus waveform 454 as the digital stimulus waveform for the system under test 200.

Figure 7D:
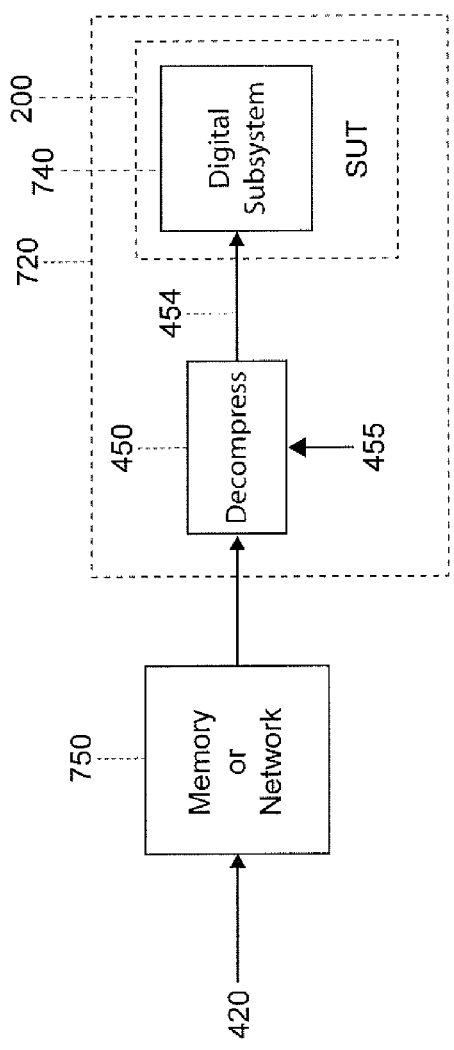
FIG. 7d is a block diagram of a self-testing system with an integrated decompressor, in accordance with a preferred embodiment.

FIGS. 7c and 7d show embodiments where the stimulus decompressor 450 and the SUT 200 are integrated in a self-testing system 720. These embodiments are applicable to BIST architectures. FIG. 7c is a block diagram of an embodiment providing an analog stimulus where the stimulus decompressor 450 is integrated with the SUT 200 in a self-testing system 720. The compressed stimulus waveform data 420 is transferred from the stimulus memory or network 750 to the stimulus decompressor 450 within the self-testing system 720. The DAC 180 converts the decompressed stimulus waveform 452 to form the analog stimulus waveform 190 input to the analog subsystem 730 of the SUT 200.

FIG. 7d is a block diagram of an embodiment providing a digital stimulus where the stimulus decompressor 450 is integrated with the SUT the self-testing system 720. The decompressed stimulus waveform 454 is provided as the digital stimulus waveform directly to the digital subsystem 740 of the SUT 200. The stimulus decompression control 455 is optional in the embodiments of FIGS. 7a-d, as described with respect to FIG. 4. Also in FIGS. 7a-d, stimulus decompressor 450 may optionally include local memory (not shown in FIGS. 7a-d) to store one or more compressed stimulus waveforms.

Figure 8C:
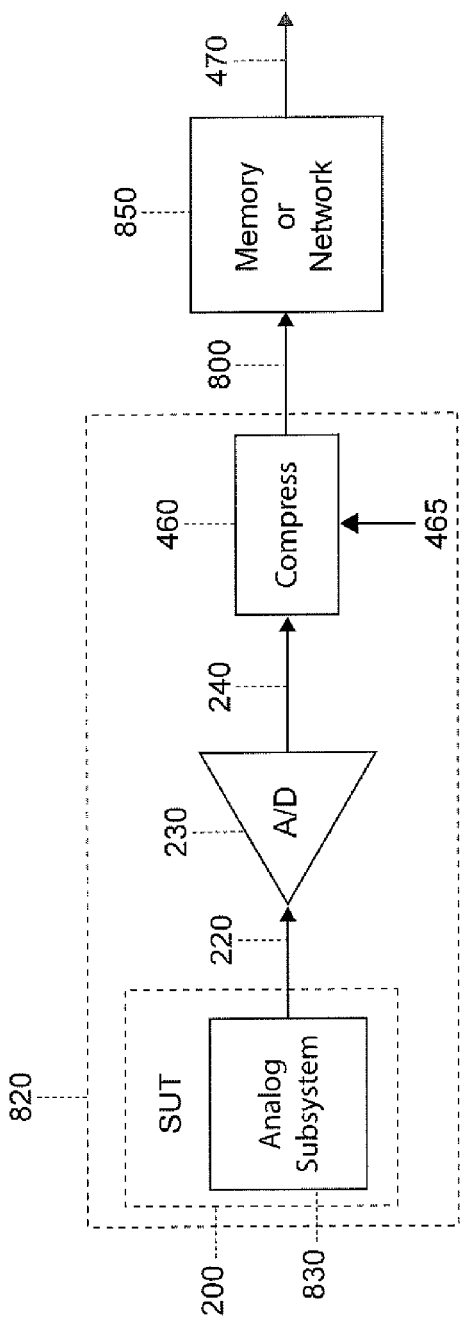
FIG. 8c is a block diagram of a self-testing system with an ADC and compressor for processing an analog response waveform, in accordance with a preferred embodiment.
Figure 8D:
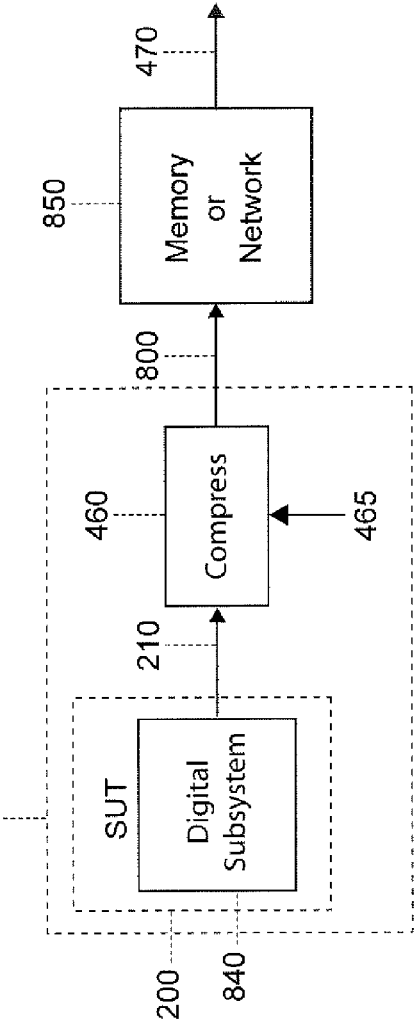
FIG. 8d is a block diagram of a self-testing system with a compressor for processing a digital response waveform, in accordance with a preferred embodiment.

FIGS. 8a-d depict various configurations for compressing the response waveform. FIGS. 8a is a block diagram of an embodiment where the response processor 810 includes response compressor 460 and a memory or network 850. The memory or network 850 stores and/or transfers the compressed response waveform data 470 to the host processor 100. In FIG. 8*a*, the SUT 200 produces an analog response waveform 220 that is converted to digital form by ADC 230 prior compression by response compressor 460. In FIG. 8*b*, the SUT 200 produces the digital response waveform 210 that is then compressed by response compressor 460. The self-testing systems of FIGS. 8*c* and 8*d* can be implemented in BIST architectures. In FIG. 8*c*, the self-testing system 820 includes an ADC 230 and response compressor 460. The SUT's analog subsystem 830 provides an analog response waveform 220 to ADC 230 for conversion to sampled response waveform 240. The response compressor 460 provides the compressed response waveform data as the self-testing system output 800 to the memory or network 850. In FIG. 8*d*, the self-testing system 820 includes the response compressor 460. The SUT's digital subsystem 840 produces the digital response waveform 210 for compression by response compressor 460 to produce the self-testing system output 800. In FIGS. 8*a-d* the response compression control 465 is optional, as described with respect to FIG. 4. In FIGS. 8*a-d*, response compressor 460 may optionally include local memory (not shown in FIGS. 8*a-d*) to store one or more compressed response waveforms.

Alternative embodiments for self-testing systems may include both the stimulus decompressor 450 and the response compressor 460. For example, an embodiment of a self-testing system providing an analog stimulus waveform 190 and an analog response waveform 220 includes the elements of self-testing system 720 of FIG. 7*c* and self-testing system 820 of FIG. 8*c*. An embodiment of a self-testing system providing a decompressed stimulus waveform 454 and a digital response waveform 210 includes the elements of self-testing system 720 in FIG. 7*d* and self-testing system 820 in FIG. 8*d*. An embodiment of a self-testing system providing an analog stimulus waveform 190 and a digital response waveform 210, includes the elements of self-testing system 720 in FIG. 7*c* and self-testing system 820 in FIG. 8*d*. An embodiment of a self-testing system providing a decompressed stimulus waveform 454 and an analog response waveform 220 includes the elements of self-testing system 720 in FIG. 7*d* and self-testing system 820 of FIG. 8*c*.

Figure 9A:
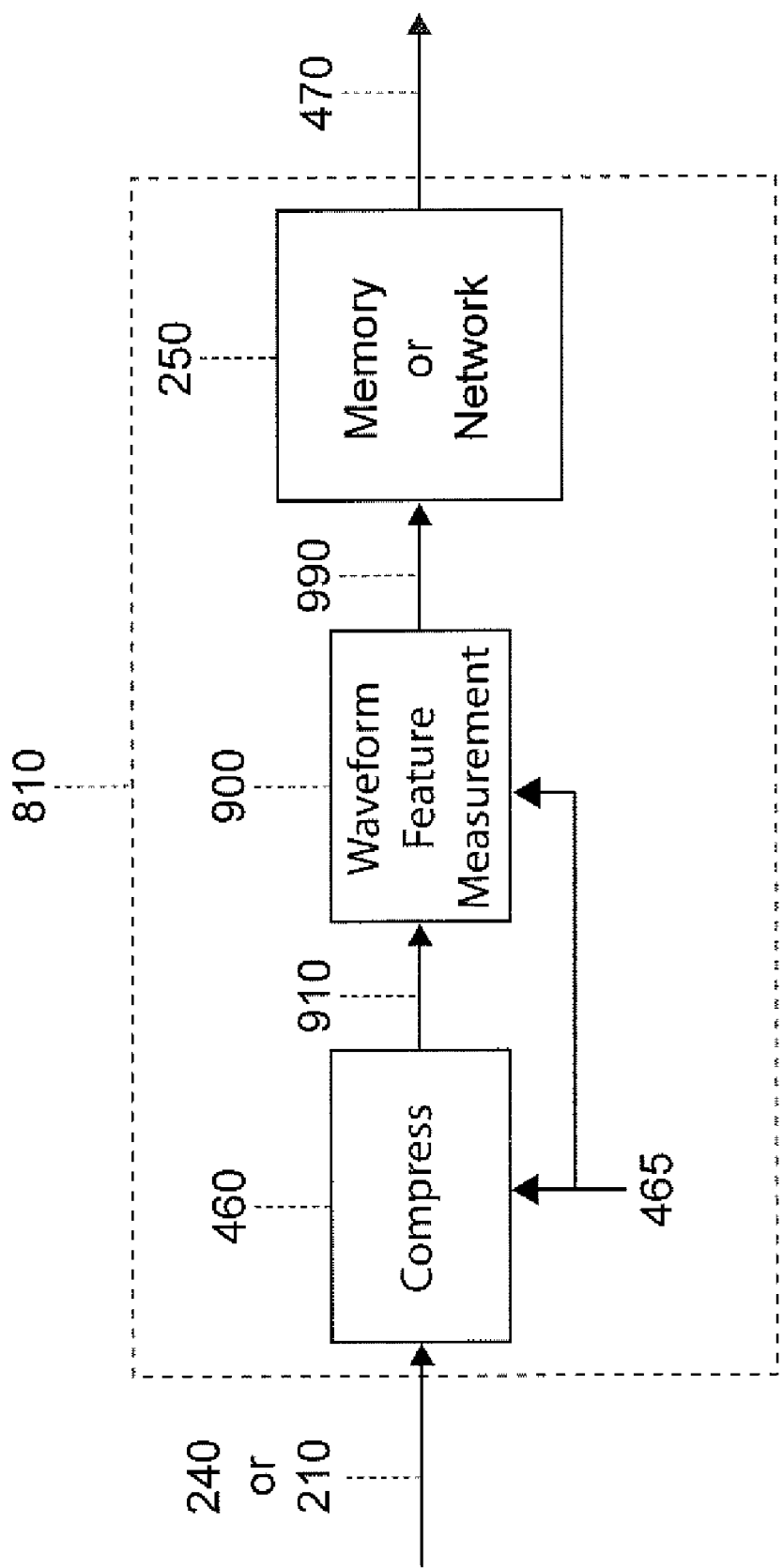
FIG. 9a is a block diagram of a response processor including compression and waveform feature measurement, in accordance with a preferred embodiment.
Figure 9B:
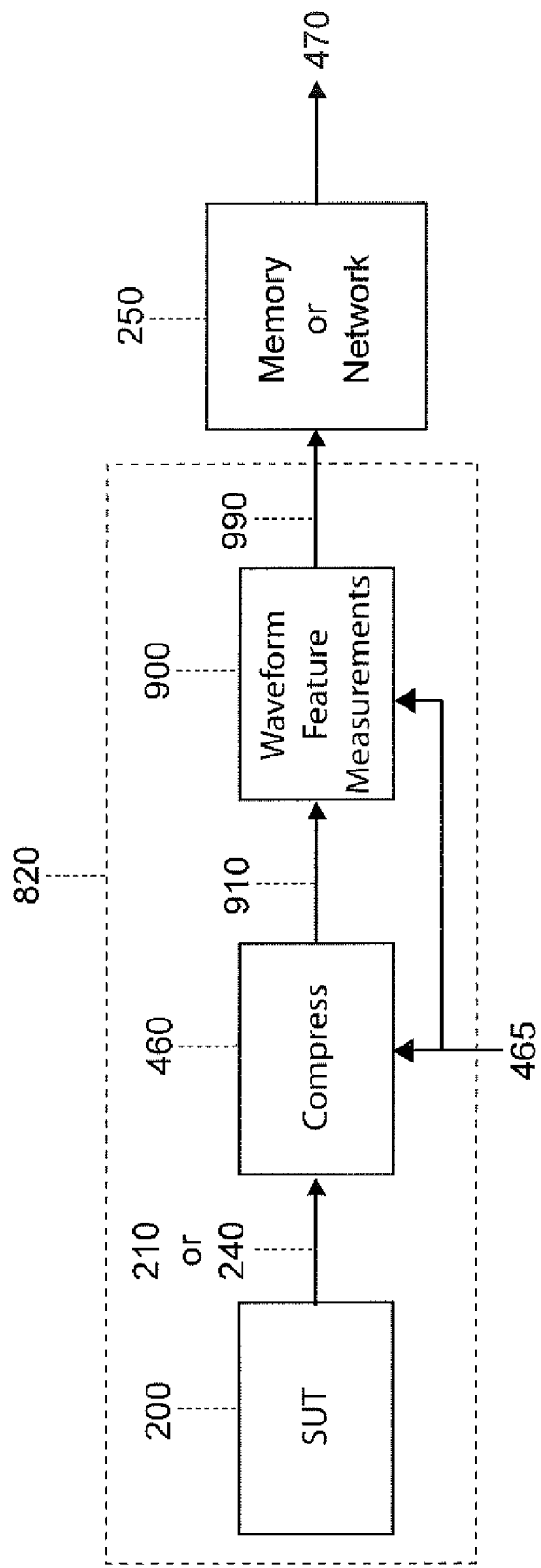
FIG. 9b is a block diagram of a self-testing system including compression and waveform feature measurement, in accordance with a preferred embodiment.

Response processor 480 can, optionally, measure parameters, or features, of the response waveform that are useful for subsequent analysis. Feature measurements can be performed on compressed response waveform data, decompressed response waveform or a digital form of response waveform before compression. FIGS. 9*a* and 9*b* are block diagrams that include compressing the response waveform and measuring the features. In FIG. 9*a*, the response processor 810 includes the response compressor 460 and the waveform feature processor 900. The response compressor 460 compresses the digital response waveform 210 or the sampled response waveform 240 from an analog response to form compressed waveform data 910. The waveform feature processor 900 measures features of the compressed waveform data 910. Alternatively, the waveform feature processor 900 can measure features of the uncompressed response waveform 210 or 240 or a combination of uncompressed and compressed data. Compressed data and features are provided as input 990 to the memory or network 250. In FIG. 9*b*, the self-testing system 820 includes response compressor 460 and waveform feature processor 900. The response compressor 460 and the waveform feature processor 900 perform the same functions as described with respect to FIG. 9*a*. The optional response compression control 465, in addition to the previously described compression control, can also control the waveform feature processor by selecting the features to be measured as well as additional calculation parameters. Alternative embodiments for self-testing systems that provide both stimulus and response can include the elements of self-testing system 820 in FIG. 9*b* for response and the elements of self-testing system 720 of FIG. 7*c* for analog stimulus or FIG. 7*d* for digital stimulus, as described previously with respect to FIGS. 8*c* and 8*d*.

Figure 10A:
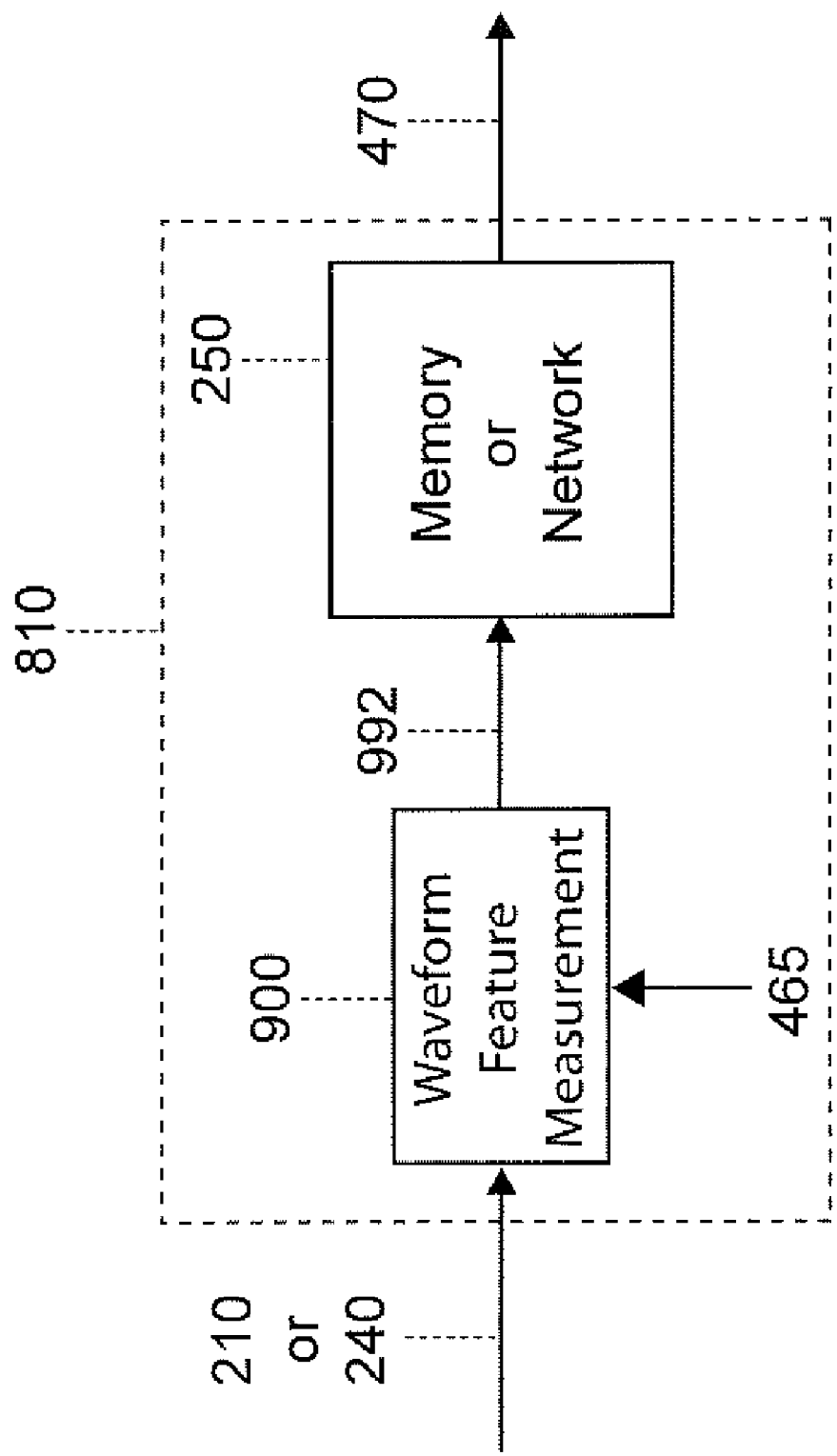
FIG. 10a is a block diagram of a response processor that includes waveform feature measurement of response waveform, in accordance with a preferred embodiment.
Figure 10B:
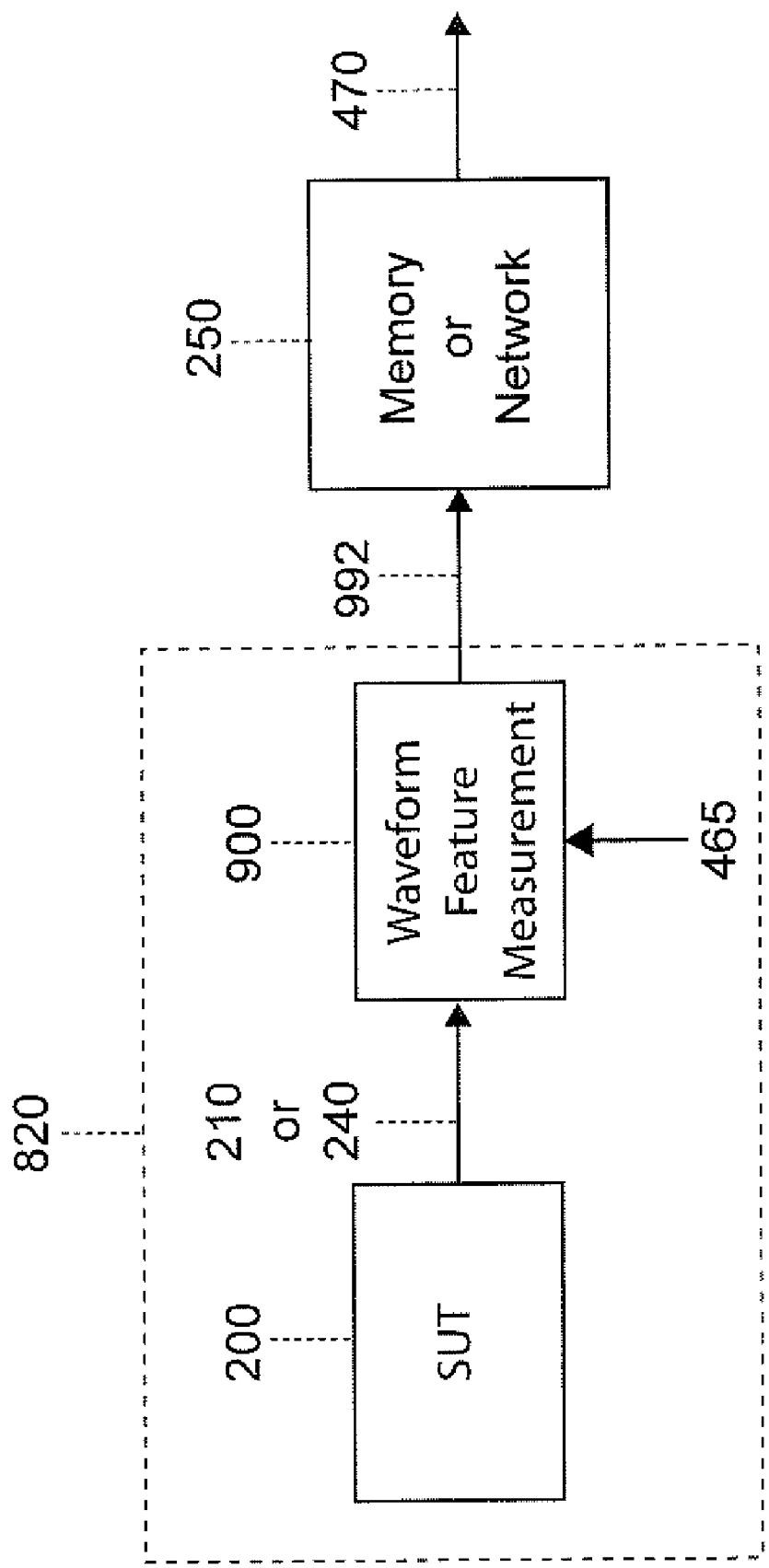
FIG. 10b is a block diagram of a self-testing system with an integrated waveform feature measurement processor, in accordance with a preferred embodiment.

In some applications, the waveform features contain the useful information so the compressed response waveform data are not required. FIGS. 10*a* and 10*b* show embodiments where only the features of the response waveforms are measured. In FIG. 10*a*, response processor 810 includes the waveform feature processor 900 that extracts features from the response waveform 210 or 240. The extracted feature date are input 992 to the memory or network 250. In FIG. 10*b*, the self-testing system 820 includes the waveform feature processor 900. The waveform feature processor 900 calculates the features of the response waveform 210 or 240 generated by the digital or analog subsystems, respectively, to form extracted feature data as input 992 to the memory or network 250. For FIGS. 10*a* and 10*b*, the optional response compression control 465 can select the features to be measured as well as additional calculation parameters. Alternative embodiments for self-testing systems that provide both stimulus and response can include the elements of self-testing system 820 in FIG. 10*b* for the response and the elements of self-testing system 720 of FIG. 7*c* for analog stimulus or FIG. 7*d* for digital stimulus, as described previously with respect to FIGS. 8*c* and 8*d*.

Alternative embodiments of the present invention include configurations that provide more than one stimulus waveforms on multiple inputs of a SUT in any combination of analog and/or digital stimuli. Stimulus compressor 410 can be implemented by multiple compressors in parallel. Stimulus decompressor 450 can include multiple decompressors in parallel, each providing the stimulus waveform for a different input of the SUT. Alternatively, stimulus compressor 410 and/or stimulus decompressor 450 can compress/decompress the stimulus waveform for each SUT input serially. Alternative embodiments also include configurations that receive and process multiple response waveforms from multiple outputs of a SUT in any combination of analog and/or digital response waveforms. Response compressor 460 can include multiple parallel compressors, each compressing the response waveform from one of the SUT outputs. Waveform feature processor 900 can also include multiple parallel waveform feature processors. The response decompressor 490 can also include multiple parallel decompressors. Alternatively, one or more of the response compressor 460, waveform feature processor and response decompressor 490 can operate serially on the multiple response waveforms. In another alternative, multiple decompressed stimulus waveforms can be provided to two or more DUTs or SUTs, thus implementing a stimulus generator for multi-site ATE, where two or more devices can be tested in parallel.

The stimulus compressor 410 and response compressor 460 apply lossless or lossy compression methods to their respective input waveform samples. The present inventor describes compression algorithms for bandlimited waveforms in detail in the '852 patent. The description includes both lossless and lossy compression, selection of compression control parameters according to a desired compression ratio or desired decompressed signal quality, and measurement of signal parameters, including center frequency and noise floor. In the '771 application the present inventor describes efficient compression algorithms for waveform samples output from a TIADC. The algorithms described therein would be applicable to embodiments of the present invention if the ADC 230 comprises a TIADC. In the '147 application the present inventor describes efficient algorithms for compressing waveforms with two or more recurring waveform states. The algorithms described therein separate the waveform samples into different waveform states and encode the samples according to each waveform state. Also described are methods for measuring useful features and their statistics using the waveform samples and the compressed waveform data. The '852 patent, the '771 application and the '147 application also include descriptions of the corresponding decompression methods that are applicable to the stimulus decompressor 450 and the response decompressor 490. The compression and decompression algorithms described involve simple computations so that compression and decompression can be performed in real time, or at least as fast as the sample rate of the waveform samples.

Figure 11:
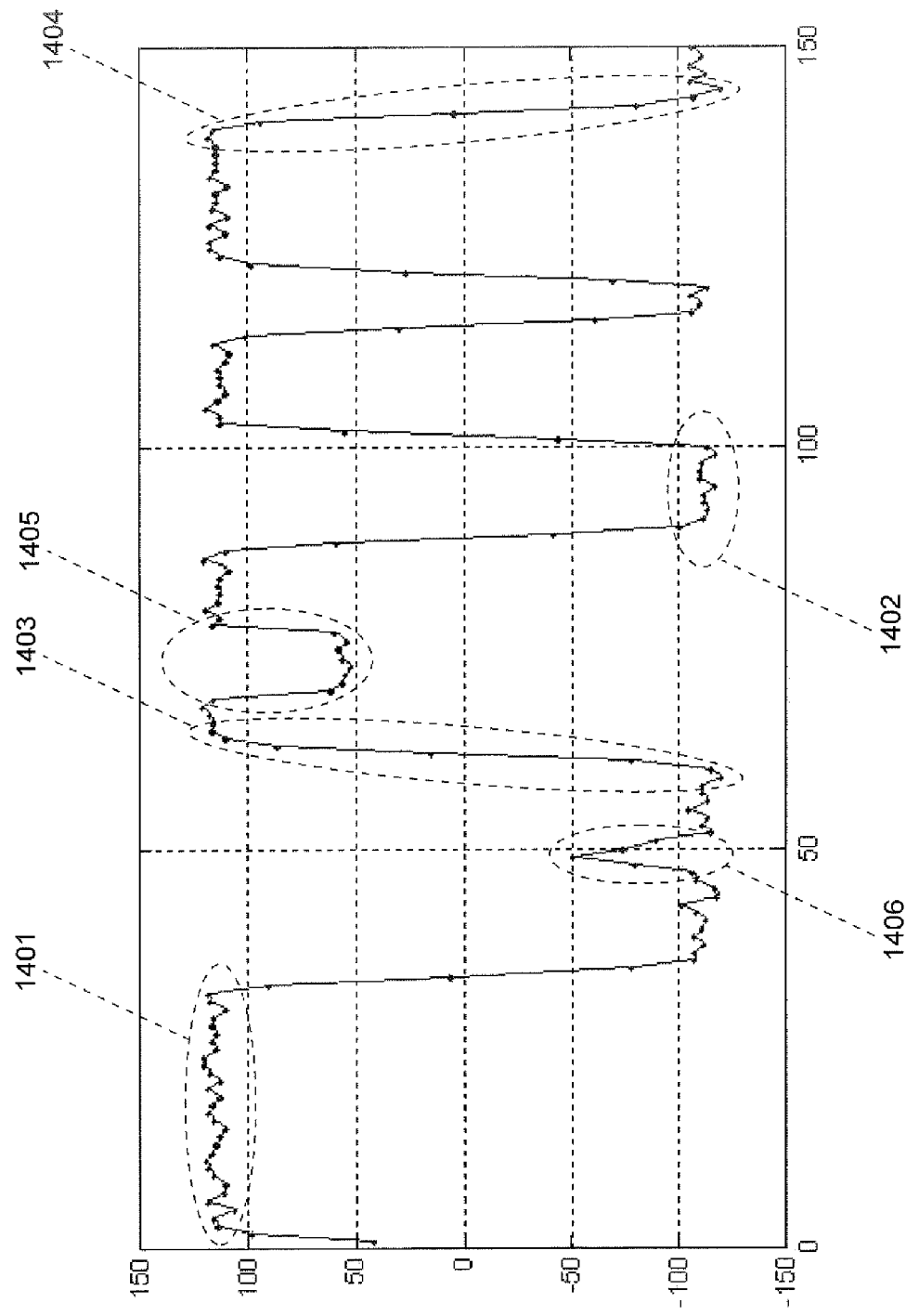
FIG. 11 is an example of a waveform with level portions, edge portions and glitches.

A preferred embodiment of the present invention applies when the stimulus and/or response waveform has two or more recurring waveform states. This type of waveform is common in test and measurement systems. Compression methods described in the '147 application for waveforms having level portions and edge portions can achieve compression ratios of about 2:1 to 3:1 for lossless compression and greater compression ratios for lossy compression. The following description for FIGS. 11 through 17 includes excerpts from the text and figures of the '147 application. FIG. 11 (FIG. 4 in the '147 application) is an example of a waveform that has recurring characteristics, including level portions and edge portions. In addition to the level portions and edge portions, the waveform has "glitches" that include waveform samples that are discontinuous with the pattern of neighboring samples. The characteristics of the waveform in FIG. 11 include a high level portion 1401 having a high level amplitude, a low level portion 1402 having a low level amplitude, a rising edge 1403, a falling edge 1404, a positive glitch 1406 that deviates in the positive direction, and a negative glitch 1405 that deviates in the negative direction. Because the amplitudes of most of the samples cluster around specific level states, specifying an encoder for each level state will provide more efficient compression than applying the same encoder to all samples. The waveform characteristics can also include multiple amplitude levels, frequency states and phase states.

Figure 12:
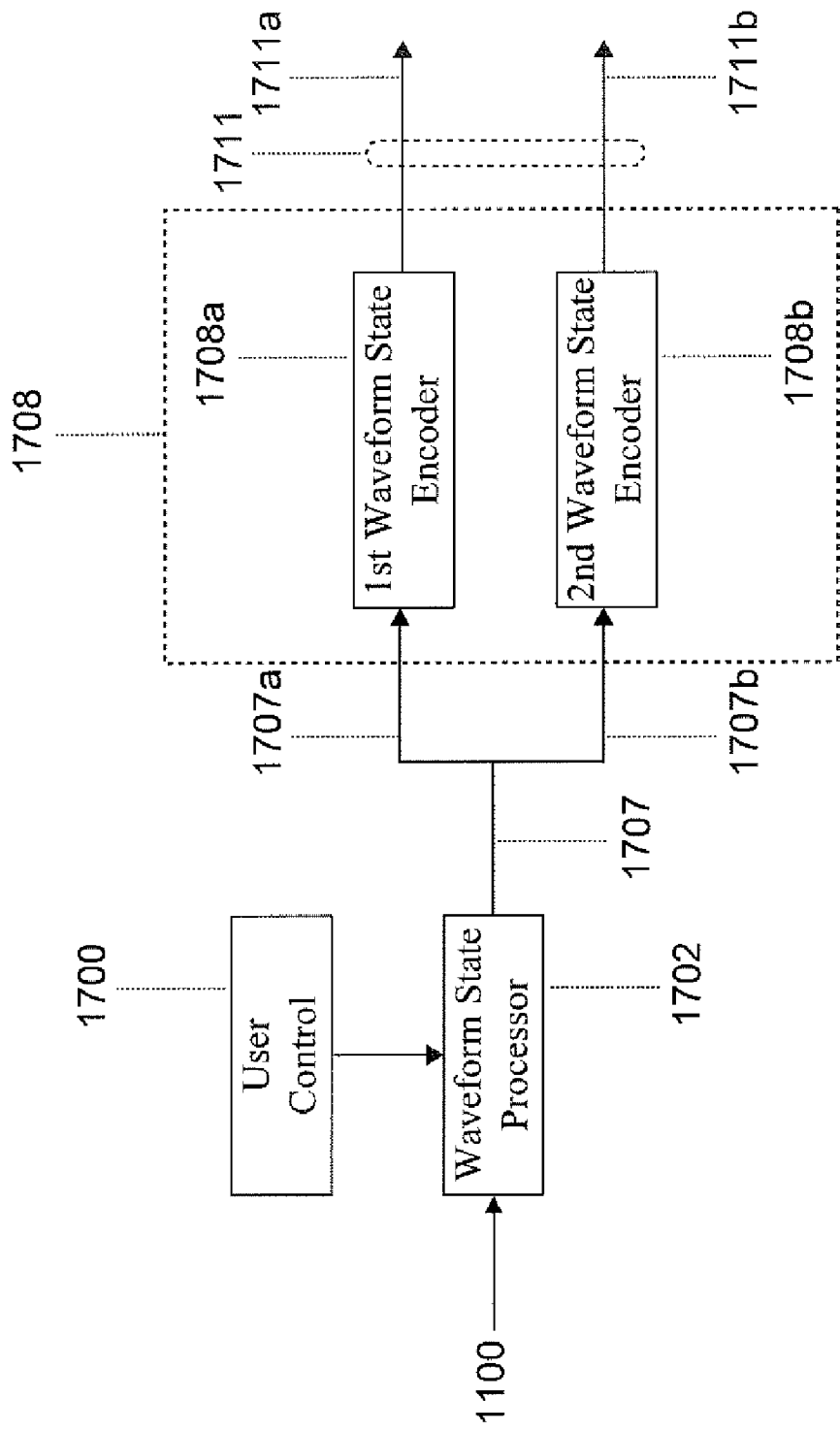
FIG. 12 is a block diagram of a compressor, in accordance with a preferred embodiment.

FIG. 12 (FIG. 7 in the '147 application) is a block diagram of a preferred embodiment for the stimulus compressor 410 and/or the response compressor 460 for compressing waveform samples with at least two waveform states. Waveform state processor 1702 determines the waveform states of the waveform samples 1100 and produces waveform state sample vectors for encoder input 1707. Referring to FIG. 4, the waveform samples 1100 correspond to the stimulus waveform samples 411 input to stimulus compressor 410, the digital response waveform samples 210 input to the response compressor 460 or the sampled response waveform samples 240 input to the response compressor 460. Each waveform state sample vector includes consecutive waveform samples in a particular waveform state. Encoder 1708 includes a waveform state encoder for each waveform state. The waveform state sample vectors are directed to the corresponding waveform state encoder. For this example, waveform state sample vectors corresponding to the first waveform state are input 1707a to the first waveform state encoder 1708a and waveform state sample vectors corresponding to the second waveform state are input 1707b to waveform state encoder 1708b. The waveform state encoders 1708a and 1708b apply encoding specific for the waveform state to the waveform state sample vectors to produce compressed waveform data at the encoder output 1711. Depending on the application, the encoder output 1711 may be either maintained as separate compressed data stream outputs 1711a and 1711b or multiplexed into a single stream. Maintaining separate compressed data streams is advantageous when the compressed data for the different waveform states are stored in separate memory segments defined for each waveform state. It is also useful when further analysis of the compressed data for feature measurements or for generating statistics is required. Alternatively, compressed data stream outputs 1711a and 1711b can be multiplexed into a single stream for transfer over a high-speed interface. User control 1700 allows a user to select the waveform states to be captured and compressed.

For the waveforms illustrated in FIG. 11, the waveform states correspond to two level states, two edge states and two glitch states. The waveform state processor 1702 selects waveform samples in a level portion for a level state of the waveform. The encoder for a given level state, for instance waveform state encoder 1708a, encodes all samples in that level state. Samples that are not in a level portion are defined to be in an edge portion of the sampled waveform. The waveform state processor 1702 determines an edge state for samples in each edge portion. The waveform state processor 1702 also detects glitch portions of the sampled waveform.

Figure 13:
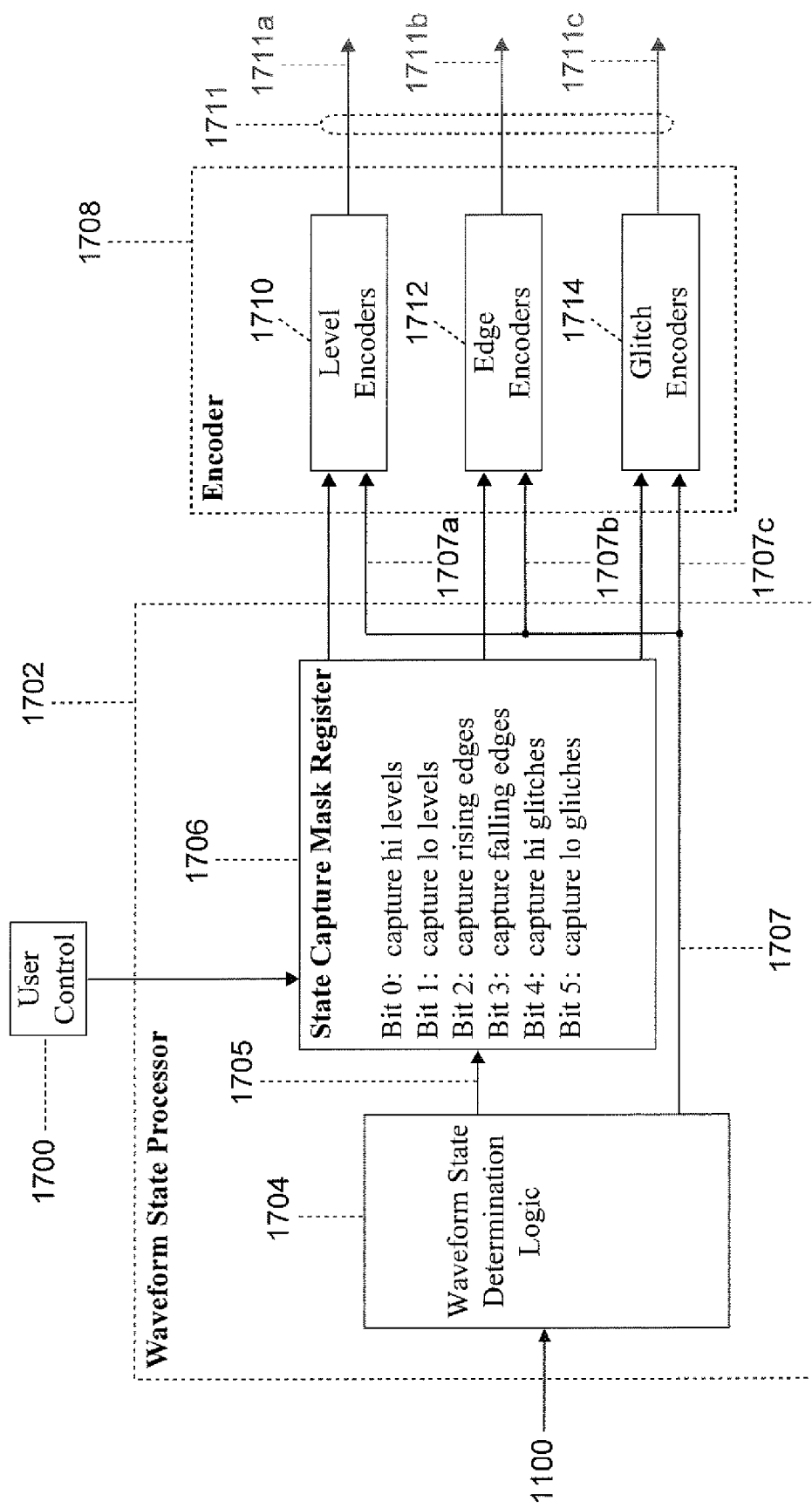
FIG. 13 is a block diagram of a compressor for a waveform having level states, edge states and glitch states in accordance with a preferred embodiment.

FIG. 13 (FIG. 8 in the '147 application) is a block diagram of a preferred embodiment of the stimulus compressor 410 and/or the response compressor 460 for waveform samples having level states, edge states and glitch states. The waveform state processor 1702 includes state determination logic 1704 and state capture mask register 1706. Waveform samples 1100 are input to state determination logic 1704 of the waveform state processor 1702. State determination logic 1704 applies algorithms described below for determining samples that are in level states, edge states and glitch states. The samples detected for the different states comprise waveform state sample vectors 1707. The waveform state sample vectors 1707 are transferred to their respective encoders. Level state sample vectors form input 1707a to level encoder 1710. Level encoder 1710 includes encoders for each level state. For example, for two level states, there are two level encoders 1710. Edge state sample vectors form input 1707b to edge encoder 1712. Edge encoder 1712 includes an encoder for rising edge samples and an encoder for falling edge samples. Glitch state sample vectors form input 1707c to glitch encoder 1714. The state determination logic 1704 also provides a state indicator 1705 to the state capture mask register 1706. The state capture mask register 1706 allows selective encoding of the various states according to user control 1700. For example, state capture mask register 1706 may direct that only samples in a high level state are captured and encoded when Bit 0=1 and Bits 1 to 5 are zero. For another example, state capture mask register 1706 may direct that only samples in high, or positive, glitches and low, or negative, glitches are captured when Bit 4=1 and Bit 5=1 and Bits 0 to 3 are zero. Waveform state encoders 1710, 1712 and 1714 encode the waveform state sample vectors received via inputs 1707a, 1707b and 1707c, respectively, to form compressed waveform data at the encoder output 1711.

In a preferred embodiment, the level encoder 1710 includes Huffman encoding of the samples in the level state sample vector. In Huffman encoding, the number of bits in the token representing an amplitude level is inversely proportional to the frequency of samples having that amplitude level.

In an alternative embodiment, the level encoder 1710 encodes the difference between each sample in the level state sample vector and a level state parameter. The level state parameter can be the mean amplitude for samples in that level state or the amplitude threshold for that level state. The difference samples can then be Huffman-encoded or quantized. For quantizing, the number of bits per sample is fixed, unlike Huffman encoding. Quantizing can provide lossy encoding by reducing the number of bits allocated per sample. For example, if the range of values requires three bits per sample for an exact representation, quantizing to two bits per sample provides additional compression, although error is introduced. The user can determine when the additional compression justifies the introduction of error.

Another useful level parameter is the level's run length. The level's run length can be measured in number of samples. Alternatively, when the run lengths are multiples of a minimum run length, they can be represented by the values of the multiples. For bauded signals, the minimum run length corresponds to the time interval for one baud. For a rectangular pulse sequence, the minimum run length corresponds to the time interval for one pulse. For convenience, the number of samples in the minimum run length for a level will be referred to as the number of samples per baud and a measure of run length will be referred to as the number of bauds. However, this is not intended to narrow the scope of the invention to bauded signals only. Using the number of bauds to measure run length may result in leftover samples because the ratio of the baud rate to the sample rate may not be a whole number. Both the run length in bauds and number of leftover samples can be Huffman-encoded.

Figure 14:
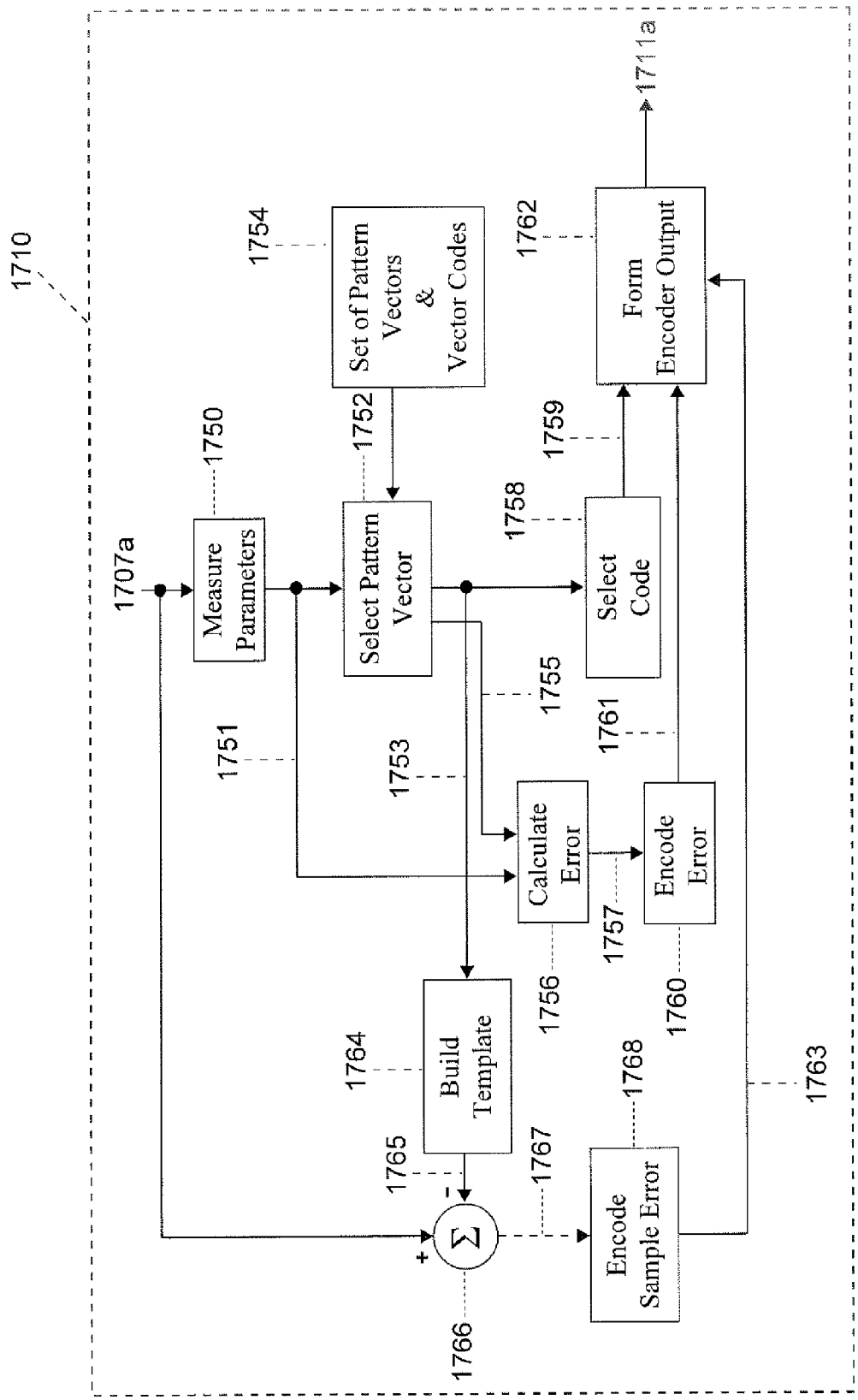
FIG. 14 is a block diagram for a level encoder for a compressor, in accordance with an alternative embodiment.

FIG. 14 (FIG. 13 in the '147 application) is a block diagram of an alternative embodiment for the level encoder 1710 that encodes level parameter vectors. The measure parameters block 1750 measures one or more parameters of the level state sample vector input 1707a to form a level parameter vector 1751. For example, the amplitude threshold, mean value and run length of the level can be measured to form a level parameter vector 1751. Vector encoding can be applied to the level parameter vector 1751 using a predetermined set 1754 of level pattern vectors and associated level vector codes. The set 1754 of level pattern vectors may be determined during a training period, as described in the '147 application. The selecting block 1752 compares one or more parameters of the level parameter vector 1751 to the corresponding parameters of the level pattern vectors of the set 1754 to select a level pattern vector 1753 to represent the parameter vector 1751. The select code block 1758 assigns the level code 1759 corresponding to the selected pattern vector 1753. If desired, calculate error block 1756 can calculate a parameter error 1757 between the level parameter vector 1751 and corresponding parameters 1755 of the selected pattern vector 1753. Calculating the parameter error 1757 is useful for observing variations in the parameters over time. The encode error block 1760 then encodes the parameter error 1757 or quantizes the error 1757 prior to encoding it. The level vector code 1759 and the encoded error 1761 are input to the form level encoder output block 1762 where they are used to form part of the level encoder output 171 la. Differences between the level parameter vectors 1751 and the selected pattern vectors 1753 may change in later regions of the waveform. For instance, baud rate variation, amplitude drift and nonlinearities can be tracked using the encoded parameter error 1761.

Reconstructing the waveform samples using the selected level pattern vector 1753 will not always regenerate the same waveform samples in the level state sample vector 1707a, resulting in lossy encoding. Lossless encoding of the samples of the level state sample vector 1707a can also be achieved. The build template block 1764 uses the selected pattern vector to build a corresponding level state template 1765. The build template block 1764 can be a look-up table of level state templates corresponding to level pattern vectors in the set 1754. Subtractor 1766 subtracts the level state template 1765 from the level state sample vector 1707a to form sample error 1767. The encode sample error block 1768 then encodes the sample error 1767. When the encode sample error block 1768 applies lossless encoding, the level state sample vector encoding will be lossless. Conversely, when the encode sample error block 1768 applies lossy encoding, the level state sample vector encoding will be lossy. The encoded sample error 1763 is input to the form level encoder output block 1762 where it forms part of the level encoder output 1711a.

For decompression by stimulus decompressor 450 and/or response decompressor 490, the level state sample vector is reconstructed from the selected code 1759 and the encoded sample error 1763. A decoder uses the code 1759 to select a corresponding level state template, which would be the same as the corresponding level state template 1765. The encoded sample error 1763 is decoded to form a reconstructed sample error. The decoder adds the reconstructed sample error to the corresponding level state template to form a reconstructed level state sample vector. For lossless encoding, the samples in the reconstructed level state sample vector would have the same amplitudes as the samples in the level state sample vector 1707a.

For embodiments that include response waveform feature measurements by the waveform feature processor 900 the level encoder 1710 includes feature extraction. The measure parameters block 1750 can also measure features of the level state sample vector in addition to the parameters used for the encoding embodiment depicted in FIG. 14, thus performing functions of the waveform feature processor 900 in FIGS. 9a and 9b. Alternatively, measurement of one or more features of each level state sample vector can represent all the samples in the level state sample vector. This approach includes functions of the waveform feature processor 900 in FIGS. 10a and 10b. Since a waveform feature normally requires less storage than the samples from which a feature was extracted, storage of waveform features is also a form of compression. The user can select which features are stored for a given waveform state. The user can balance the tradeoffs between the level of detail and the amount of storage required. High levels of compression are achieved when a single feature is stored for each waveform state sample vector. Lower levels of compression are achieved when more waveform features or information about each individual sample in the waveform state vector is captured and stored. Examples of single-feature representation include the mean, median or mode of the samples in each level state sample vector. Examples of a two-feature representation for each level state sample vector can include the mean and variance of its samples, the mean and standard deviation of its samples, or the minimum and maximum samples. The measured features can be arranged to form a level state feature vector that corresponds to the level state sample vector.

Prior to level encoding, the waveform state processor 1702 detects the samples belonging to each level state in order to form level state sample vectors, as described with respect to FIG. 13. The state determination logic 1704 in FIG. 13 detects levels using predetermined amplitude thresholds and predetermined duration thresholds. For a waveform with two level states, such as the example waveform shown in FIG. 11, the state determination logic 1704 applies at least two amplitude thresholds, a lower bound for the high amplitude level state and a higher bound for the low amplitude level state. When only a lower bound threshold is applied, the samples of the high amplitude level state will have an amplitude range from the lower bound threshold to the maximum sample amplitude and the samples of the low level state will have an amplitude range from the upper bound threshold to the minimum sample amplitude. These ranges can be further restricted by applying, in addition, an upper bound threshold to the high amplitude state and a lower bound threshold to the low amplitude state. In addition to the amplitude thresholds, the state determination logic 1704 applies duration thresholds. The amplitude threshold criteria for each waveform state must be met by consecutive samples whose duration is approximately one baud interval or greater, when glitches are absent. As described previously for measuring run length, when the number of samples per baud is fractional, there can be "leftover" samples. Many algorithms for applying thresholds to waveform samples for detection are known to those skilled in the art.

Figure 15:
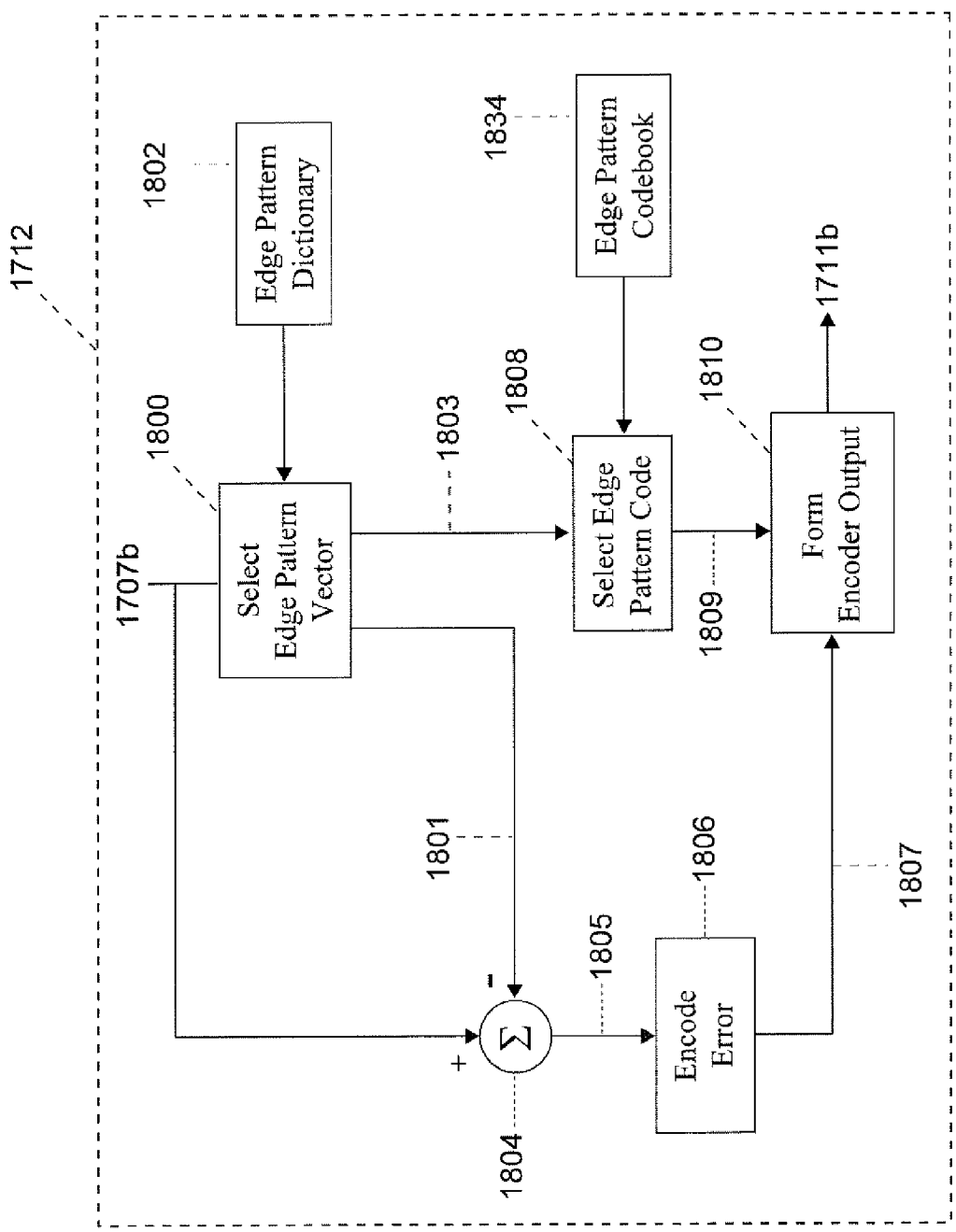
FIG. 15 is a block diagram for an edge encoder for a compressor, in accordance with a preferred embodiment.

Waveform samples positioned between adjacent level portions with different level amplitudes, or different level states, are defined as edge portions. Referring to FIG. 13, state determination logic 1704 selects samples for edge state sample vectors 1707b input to edge encoder 1712. FIG. 15 (also FIG. 15 in the '147 application) is a block diagram of a preferred embodiment for edge encoder 1712. The edge pattern vector selector 1800 selects a corresponding edge pattern vector 1801 and a corresponding edge pattern index 1803 from a predetermined set of edge pattern vectors in an edge pattern dictionary 1802 to represent an input edge state sample vector 1707b. The edge pattern vectors included in the edge pattern dictionary 1802 can be determined during training as described in the '147 application with respect to FIGS. 16 and 17 therein. Subtractor 1804 subtracts the corresponding edge pattern vector 1801 from the edge state sample vector 1707b to form the edge error 1805. The encode error block 1806 encodes the edge error 1805 to form encoded edge error 1807. A preferred embodiment for encode error block is described below with respect to FIG. 16. The edge pattern code selector 1808 selects the code assigned to the corresponding edge pattern index 1803 in accordance with the edge pattern codebook 1834. The selected edge code 1809 and the encoded edge error 1807 are input to the form edge encoder output block 1810 for forming part of the edge encoder output 1711b. In alternative embodiments, edge encoder 1712 can provide lossless or lossy encoding to the edge state sample vector 1707b. When the encode error block 1806 applies lossless encoding to the edge error 1805, the overall edge encoding process is lossless. The encode error block 1806 can perform lossy encoding by quantizing the edge error 1805 to fewer bits. The edge encoder 1712 can also perform lossy encoding using the edge pattern code 1809 alone to represent the edge state sample vector 1707b. In this embodiment, the error 1805 is not calculated so the subtractor 1804 and error encoder 1806 are not used.

The stimulus decompressor 450 or response decompressor 490 that receives the edge pattern code 1809 and the encoded edge error 1807 can reconstruct the amplitudes of the samples of the original edge state sample vector 1707b. The stimulus decompressor 450 or response decompressor 490 decodes the edge pattern code 1809 to determine the corresponding edge pattern vector. The samples of the edge state sample vector are reconstructed by adding the decoded edge error to the corresponding edge pattern vector. For lossless encoding, the amplitudes of the samples in the reconstructed edge state sample vector will equal those of the original edge state sample vector 1707b. For lossy encoding, the amplitudes of the samples in the reconstructed edge state sample vector will approximate those of the original edge state sample vector 1707b.

FIGS. 16a and 16b (FIGS. 18a and 18b in the '147 application) give an example of encoding a rising edge sample vector. FIG. 16a gives the rising edge dictionary 1848, the edge pattern indices 1850 and the edge pattern codes 1852 for the example. The edge pattern codes are Huffman codes based on the frequencies of occurrence of the pattern vectors. FIG. 16b gives an example of encoding a new rising edge sample vector 1854. Referring to FIG. 15, the rising edge sample vector 1854 is the edge encoder input 1707b and the rising edge dictionary 1848 is included in the edge pattern dictionary 1802. Edge pattern selector 1800 selects edge pattern vector 1856 for its output 1801. The subtractor 1804 calculates the edge error vector 1858 as the edge error 1805. The value of the corresponding edge pattern index 1857 is 4, which is input 1803 to the select edge pattern code block 1808. The edge pattern codes 1852 form part of the edge pattern codebook 1834. The select edge pattern code block selects the edge pattern code 1859 which is the token "11" for its output 1809.

FIG. 17 (FIG. 19 in the '147 application) gives an example of encoding the edge error in accordance with a preferred embodiment. Table A includes tokens used to encode the error samples based on the range of error in an edge error vector. When large errors are less likely to occur than smaller errors, codes are assigned based on the error range. The exponent column A1 assigns tokens that represent the ranges of error indicated in column A2. The error column A3 gives the error values within the corresponding range. The tokens column A4 gives the tokens associated with the error values for the corresponding range. The encoded edge 1860 includes the binary coded edge pattern index 1860a, "100". In this example, edge pattern code is simply the binary value of the edge pattern index, 4. The encoded edge 1860 also includes an encoded error portion 1860b and 1860c. The portion 1860b is the token indicating the range of error of (0, −1). The portion 1860c includes the encoded edge error samples (0, 0, 1, 0, 1). These correspond to edge error samples (0, 0, −1, 0, −1).

As the above examples show, when the waveform has little or no noise, the selector 1800 can select a corresponding edge pattern vector 1801 by comparing corresponding samples of the edge state sample vector and edge pattern vector. Comparing as few as one or two samples can be sufficient, especially since any edge error is encoded. For more noisy waveforms, the edge codebook entry that is selected has the smallest absolute error, the smallest average error, or the smallest of another user-specified error metric or combination of two or more metrics. Many minimum-distance error metrics are known to those skilled in the art.

As described previously with respect to level encoder 1710, feature extraction can be performed along with compression. The waveform feature processor 900 can calculate edge features. The user can select features useful for the analysis at hand. For edge states, useful features include rise and fall times and zero crossing times. Zero crossing times can further be used to extract jitter information, which is growing in importance as industry-standard serial busses such as PCI Express, Serial ATA, and Serial RapidIO become more popular. In addition, features of multiple edges used to determine positive and negative pulse widths and duty cycle can be calculated. These features can be derived from edge pattern vectors, edge state sample vectors or both. The times corresponding to zero crossing, 10% and 90% amplitudes for rise/fall times and threshold amplitudes for pulse width and duty cycle measurements can be calculated using well-known methods of interpolation. The calculated times are relative to the initial sample time of the edge pattern vector or edge state sample vector. Because the edge pattern vectors are representative of edge state sample vectors, it is efficient to analyze edge pattern vectors individually or in groups for feature extraction. For example, groups of pattern vectors can be averaged and interpolated to find an average zero crossing time.

In an alternative embodiment, a polynomial representation is used for extracting edge features. For example, the 10% to 90% rise time can be calculated once based on the polynomial model and apply to all edges represented by that polynomial. For example, the zero crossing interval is determined once relative to the initial point of the polynomial model for a rising edge. The zero crossing relative to the initial sample of a particular rising edge is determined by subtracting the temporal offset of the rising edge sample vector and from the zero crossing interval.

The feature measurements can be encoded and appended to the encoded edge state sample vectors, in accordance with the embodiments of FIGS. 9a and 9b. Alternatively, one or more feature measurements can represent all the samples in the edge state sample vector, as described previously with respect to level states, in accordance with the embodiments of FIGS. 10a and 10b. The features are arranged to form an edge state feature vector that corresponds to the edge state sample vector. A time stamp can be included with the feature data in the edge state feature vector to preserve its temporal information.

Referring to FIG. 13, the state determination logic 1704 includes a glitch detector. A glitch detector applies amplitude and duration thresholds to the waveform samples 1100. The user can specify an upper tolerance threshold for detecting positive glitches and a lower tolerance threshold for negative glitches. The duration threshold value is less than a baud interval. A positive glitch is detected when the amplitudes of consecutive samples rise above then fall below the upper tolerance during a time interval that is less than the duration threshold. A negative glitch is detected when the amplitudes fall below then rise above the lower tolerance during a time interval that is less than the duration threshold.

The glitch detector provides glitch samples for a glitch state sample vector 1707c input to glitch encoder 1714. Glitches can be represented in a variety of ways, including:
1) glitch duration (sample count) encoding,
2) glitch mean value,
3) glitch maximum and minimum values,
4) glitch sample values,
5) quantized glitch sample values,
6) glitch magnitude,
7) other glitch encoding techniques The features extracted from the pattern and sample vectors of level and edge states are used to determine commonly used measurements. As previously described, feature vectors can be formed and appended to pattern vectors and compressed sample vectors. The feature vectors for compressed sample vectors can include time stamps that are used when measuring features across more than one edge or level. Statistics for edge and level features and other measurements using those features can be computed and analyzed. Useful measurements related to time include the following.
1) Rise time and fall time—10% to 90% rise or fall time and 20% to 80% rise or fall time intervals can be calculated for individual edge pattern vectors or edge state sample vectors.
2) Zero crossing time can be calculated for individual edge pattern vectors or edge state sample vectors relative to the initial sample of the vector.
3) Positive or negative pulse width with respect to a threshold, such as 50% of level amplitude, requires features from two consecutive edges. The time interval corresponding to the threshold crossing (TX) on each edge is calculated relative to the initial sample of the respective edges. The pulse width (PW) calculation also requires the time interval between the two edges which can be calculated using time stamps (TS) for the initial samples of the respective edges as follows:

$$PW=TS_2-TS_1-TX_1+TX_2$$

Alternatively, the run length (RL) of the level state between the edges and the run length ($RE_1$) of the first edge can be used to calculate pulse width (PW) as follows:

$$PW=RE_1-TX_1+RL+TX_2$$

4) Period measured as the time interval between zero crossings, or other amplitude threshold crossings, of consecutive rising edges is calculated across three consecutive edges and the intervening level portions. The zero (or other threshold) crossing time intervals (TZ) and time stamps (TS) relative to the initial samples of the two rising edges are used to calculate the period (P) as follows:

$$P=TS_2-TS_1-TZ_1+TZ_2$$

Alternatively, the period P can be calculated using run lengths of the intervening positive and negative level portions ($RL_1$ and $RL_2$) and the first and middle edge portions ($RE_1$ and $RE_M$) between the level portions as follows:

$$P=RE_1-TZ_1+RL_4+RE_M+RL_2+TZ_2$$

Useful measurements related to amplitudes include the following.
1) Top and maximum amplitudes can be measured for high level state sample vectors or level pattern vectors. For levels with overshoot, the maximum amplitude (max) is measured in the adjacent overshoot portion.
2) Base and minimum amplitudes can be measured for low level state sample vectors or level pattern vectors. For levels with undershoot, the minimum amplitude (min) is measured in the adjacent undershoot portion.
3) Amplitude (Amp) value between low and high levels is found by:

Amp=top-base

4) The peak to peak (PP) value between low and high levels is found by:

PP=max-min

Useful measurements of glitch parameters include the following:
1) Positive glitch duration and amplitude.
2) Negative glitch duration and amplitude.
3) Percentage of bauds or pulses with glitches.

Jitter can also be measured using the level and edge features. The zero crossing times calculated for the edge state sample vectors can be used to measure timing jitter, with reference to a recovered clock signal (also called the "golden clock"), or with reference to the previous rising or falling edge. The level features calculated for the level state sample vectors can be used to measure amplitude jitter, which can often be correlated with the noise floor or signal-to-noise ratio (SNR) of the signal.

Figure 18:
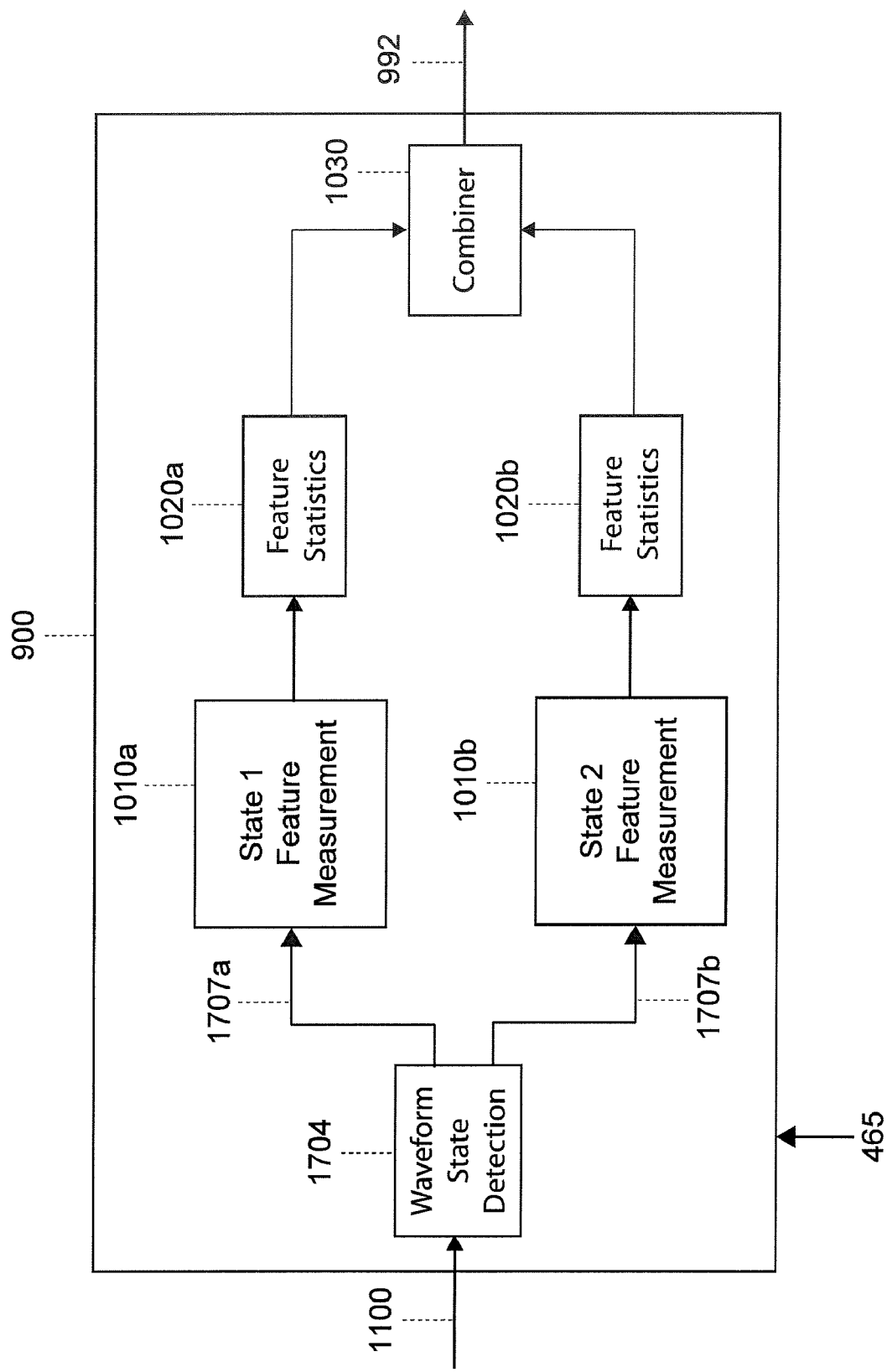
FIG. 18 is a block diagram for feature measurement based on waveform states, in accordance with a preferred embodiment.

FIG. 18 is a block diagram of an embodiment of waveform feature processor 900 for a waveform having waveform states. This embodiment is useful for the configurations illustrated in FIGS. 10a and 10b. The digital response waveform 210 or sampled response waveform 240 corresponds to the waveform samples 1100. The state determination logic 1704 detects the states of the waveform samples 1100 and forms the waveform state sample vectors 1707a and 1707b. State feature measurement blocks 1010a and 1010b measure features of the respective waveform state sample vectors. For example, for waveforms having level states and edge states, the state feature measurement blocks 1010a and 1010b and calculate the level state features and the edge state features as described above. Feature statistics processors 1020a and 1020b calculate statistics on the measured features for each state, such as averages, variances, maximums, minimums, modes, etc. The combiner 1030 organizes the feature measurements and statistics for the waveform states into a data stream that is input 992 to the memory or network 250 in FIGS. 10a and 10b. The response compression control 465 provides for control and selection of the waveform states, feature measurements and statistical measurements.

The compression methods applied by stimulus compressor 410 and response compressor 460, decompression methods applied by stimulus decompressor 450 and response decompressor 490 and feature measurements applied by waveform feature processor 900 are not limited to those described above for the preferred embodiments for stimulus and response waveforms having waveform states. Other algorithms or methods for compression, decompression and feature measurement can be applied without departing from the spirit and scope of present invention. However, it is important that implementations of the compression and decompression algorithms can operate in real time so that they are effective in mitigating data transfer bottlenecks.

The present invention can be implemented in test and measurement systems using a variety of technologies. Referring to FIG. 4, the stimulus compressor 410 and response decompressor 490 can be implemented in software in the host computer 100. Referring to FIGS. 7a and 7b, the stimulus decompressor 450 can be part of a stimulus source device 710. The stimulus source device can be implemented in a test head 300 in the test system architecture of FIG. 2 or in the test chassis 330 of in the test system architecture of FIG. 3. Similarly, the response compressor 460 of FIGS. 8a, 8b and 9a and the waveform feature processor 900 of FIGS. 9a and 10a can be part of a response processor 810. The response processor 810 can be implemented in the test head 300 of the test system architecture of FIG. 2 or in the test chassis 330 of the test system architecture of FIG. 3. For these test system architectures, the stimulus decompressor 450, response compressor 460 and the waveform feature processor 900 can be implemented in software and/or firmware in at least one of a microprocessor, microcontroller and digital signal processor (DSP). They can also be implemented in hardware in an field programmable gate array (FPGA), complex programmable logic device (CPLD) or application specific integrated circuit (ASIC). Referring to FIGS. 7c and 7d, the stimulus decompressor 450 can be part of a self-testing system 720 in a BIST architecture. Referring to FIGS. 8c, 8d and 9b, the response compressor 460 and the waveform feature processor 900 of FIGS. 9b and 10b can be part of a self-testing system 820 in a BIST architecture. For the BIST architectures the stimulus decompressor 450, the response compressor 460 and the waveform feature processor 900 can be implemented as parts of a testing core embedded in a SoC.

Embodiments of compression and decompression in an ASIC can be implemented using ASIC design tools and methodologies well known to those skilled in the art. An ASIC implementation of the compression and/or decompression algorithms of the present invention can be designed using a hardware description language such as VHDL or Verilog. The register-transfer-level (RTL) representation generated in VHDL or Verilog can then be synthesized into a gate-level representation of the algorithms for the ASIC implementation. The hardware description language instructions can be stored on a CD-ROM, hard disk or other computer-readable medium for distribution and downloading to a processor that will synthesize the ASIC implementation.

The compression and decompression can also be implemented in one or more programmable processors. The programmable processors include software/firmware programmable processors such as computers, digital signal processors (DSP), microprocessors (including microcontrollers) and other programmable devices, and hardware programmable devices such as complex programmable logic devices (CPLD), field programmable gate arrays (FPGA) devices. Depending on the type of programmable processor, the program implementing the operations of the present invention is represented by software, firmware, netlist, bitstream or other type of processor executable instructions and data.

Implementations of the present invention can perform waveform state compression in real time, that is, at least as fast as the sample rate of the waveform samples, after the training phase. Waveform state compression operations include threshold comparators for determining waveform states, accessing pattern vectors from memory and subtractors. For compression of edge state sample vectors, the first sample in the edge state sample vector is used to indicate an index for a table of the edge pattern vectors in memory. Determining the index using the first sample or another sample of the edge state sample vector is a simple operation. Embodiments using Huffman encoding for level state encoding also involve simple table look-ups. Decompression operations can also be performed in real time. Decompression operations involve using codes in the compressed waveform data to look up the associated pattern vectors, decoding any error and adding the decoded error to the pattern vector. Huffman decoding for the level states again involves simple table look-up.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. In a test system for a device under test (DUT) that includes a host processor, a device input interface connected to an input of the DUT, a device output interface connected to an output of the DUT, a stimulus interface coupling the host processor to the device input interface and a response interface coupling the device output interface to the host processor, a method for transferring stimulus and response waveforms between the DUT and the host processor, wherein the DUT responds to the stimulus waveform to produce the response waveform, wherein the stimulus waveform is represented by a plurality of stimulus waveform samples in the host processor, the method comprising:
   at the host processor:
      compressing the plurality of stimulus waveform samples to form compressed stimulus waveform data;
      transferring the compressed stimulus waveform data to the stimulus interface;
   at the device input interface:
      retrieving the compressed stimulus waveform data from the stimulus interface;

decompressing the compressed stimulus waveform data to form a decompressed stimulus waveform;
providing the decompressed stimulus waveform as the stimulus waveform to the input of the DUT;
at the device output interface:
receiving the response waveform from the output of the DUT, wherein the response waveform is generated by the DUT in response to the stimulus waveform provided to the DUT;
compressing a plurality of samples of the response waveform to form compressed response waveform data;
transferring the compressed response waveform data to the response interface;
at the host processor:
retrieving the compressed response waveform data from the response interface; and
decompressing the compressed response waveform data to form a decompressed response waveform.

2. The method of claim 1, wherein the stimulus waveform is an analog stimulus waveform, the step of providing the decompressed stimulus waveform further comprising:
converting the decompressed stimulus waveform to an analog form to produce the analog stimulus waveform; and
providing the analog stimulus waveform as the stimulus waveform to the input of the DUT instead of the decompressed stimulus waveform.

3. The method of claim 1, wherein at least one of the step of compressing the plurality of stimulus waveform samples and the step of decompressing the compressed stimulus waveform data is performed in accordance with a control parameter.

4. The method of claim 1, wherein at least one of the step of compressing the plurality of stimulus waveform samples and the step of compressing a plurality of samples of the response waveform operates in one or more compression modes, including at least one of a lossless compression mode and a lossy compression mode.

5. The method of claim 1, wherein at least one of the stimulus interface and the response interface comprises a data storage device, including but not limited to at least one of a memory and a computer-readable medium.

6. The method of claim 1, wherein at least one of the stimulus interface and the response interface comprises a data transfer interface, including but not limited to at least one of a bus, a cable and a network.

7. The method of claim 1, wherein the response waveform is an analog response waveform, the step of receiving the response waveform further comprising:
converting the analog response waveform to a digital form to produce the plurality of samples of the response waveform.

8. The method of claim 1, wherein the step of compressing a plurality of samples of the response waveform and the step of decompressing the compressed response waveform data are performed in accordance with a control parameter.

9. The method of claim 1, further comprising:
measuring a feature of at least one of the response waveform, the compressed response waveform data and the decompressed response waveform.

10. In a test system for a device under test (DUT) that includes a host processor, a device interface connected to an input of the DUT and an interface coupling the host processor to the device interface, a method for sending a stimulus waveform to the device under test from the host processor, wherein the stimulus waveform is represented by a plurality of stimulus waveform samples in the host processor and wherein the DUT responds to the stimulus waveform to produce a response waveform, the method comprising:
at the host processor:
compressing the plurality of stimulus waveform samples to form compressed stimulus waveform data;
transferring the compressed stimulus waveform data from the host processor to the interface;
at the device interface:
retrieving the compressed stimulus waveform data from the interface;
decompressing the compressed stimulus waveform data to form a decompressed stimulus waveform; and
providing the decompressed stimulus waveform as the stimulus waveform to the input of the device under test.

11. The method of claim 10, wherein the stimulus waveform is an analog stimulus waveform, the step of providing the decompressed stimulus waveform further comprising:
converting the decompressed stimulus waveform to an analog form to produce the analog stimulus waveform; and
providing the analog stimulus waveform as the stimulus waveform to the input of the device under test instead of the decompressed stimulus waveform.

12. The method of claim 10, wherein at least one of the step of compressing and the step of decompressing is performed in accordance with a control parameter.

13. The method of claim 10, wherein the step of compressing operates in one or more compression modes, including at least one of a lossless compression mode and a lossy compression mode.

14. The method of claim 10, wherein the interface comprises a data storage device, including but not limited to at least one of a memory and a computer-readable medium, the step of transferring further comprising storing the compressed stimulus waveform data in the data storage device and the step of retrieving further comprising retrieving the compressed stimulus waveform data from the data storage device.

15. The method of claim 10, wherein the interface comprises a data transfer interface, including but not limited to at least one of a bus, a cable and a network, the step of transferring further comprising transferring the compressed stimulus waveform data via the data transfer interface and the step of retrieving further comprising receiving the compressed stimulus waveform data from the data transfer interface.

16. In a test system for a device under test (DUT), an apparatus for transferring stimulus and response waveforms between the DUT and a host processor in the test system, the DUT having an input and an output, wherein the DUT responds to the stimulus waveform received at the input to produce the response waveform at the output, wherein the stimulus waveform is represented by a plurality of stimulus waveform samples in the host processor, the method comprising:
a stimulus compressor coupled to receive the plurality of stimulus waveform samples from the host processor and producing compressed stimulus waveform data;
a stimulus interface coupled to receive the compressed stimulus waveform data from the stimulus compressor;
a stimulus decompressor coupled to the stimulus interface, the stimulus decompressor retrieving the compressed stimulus waveform data from the stimulus interface and decompressing the compressed stimulus waveform data to form a decompressed stimulus waveform;
a device input interface coupled to the stimulus decompressor and to the input of the DUT, the device input interface providing the decompressed stimulus waveform as the stimulus waveform to the input of the DUT;

a device output interface coupled to receive the response waveform from the output of the DUT, wherein the response waveform is generated by the DUT in response to the stimulus waveform provided to the DUT;

a response compressor coupled to the device output interface and compressing a plurality of samples of the response waveform to form compressed response waveform data;

a response interface coupled to receive the compressed response waveform data from the response compressor; and a response decompressor coupled to receive the compressed response waveform data from the response interface and decompressing the compressed response waveform data to form a decompressed response waveform provided to the host processor.

17. The apparatus of claim 16, wherein the stimulus waveform is an analog stimulus waveform, the device input interface further comprising:

a digital-to-analog converter coupled to receive the decompressed stimulus waveform and converting the decompressed stimulus waveform to an analog form to produce the analog stimulus waveform, wherein the analog stimulus waveform is provided as the stimulus waveform to the input of the DUT instead of the decompressed stimulus waveform.

18. The apparatus of claim 17, wherein the stimulus decompressor, the device input interface, including the digital-to-analog converter, the device under test, the device output interface and the response compressor are adapted to be implemented in a self-testing system for the device under test, wherein the self-testing system is coupled to receive the compressed stimulus waveform data from the stimulus interface and is coupled to provide the compressed response waveform data to the response interface.

19. The apparatus of claim 17, wherein the stimulus decompressor, the device input interface, the device under test, the device output interface, including the analog-to-digital converter, and the response compressor are adapted to be implemented in a self-testing system for the device under test, wherein the self-testing system is coupled to receive the compressed stimulus waveform data from the stimulus interface and is coupled to provide the compressed response waveform data to the response interface.

20. The apparatus of claim 16, wherein at least one of the stimulus compressor, the stimulus decompressor, the response compressor and the response decompressor operates in accordance with a control parameter.

21. The apparatus of claim 16, wherein at least one of the stimulus compressor and the response compressor operate in one or more compression modes, including at least one of a lossless compression mode and a lossy compression mode.

22. The apparatus of claim 16, wherein at least one of the stimulus interface and the response interface comprises a data storage device, including but not limited to at least one of a memory and a computer-readable medium.

23. The apparatus of claim 16, wherein at least one of the stimulus interface and the response interface comprises a data transfer interface, including but not limited to at least one of a bus, a cable and a network.

24. The apparatus of claim 16, wherein the response waveform is an analog response waveform, the device output interface further comprising:

an analog-to-digital converter coupled to receive the analog response waveform the output of the DUT and converting the analog response waveform to a digital form to produce the plurality of samples of the response waveform.

25. The apparatus of claim 16, wherein the stimulus decompressor, the device input interface, the device under test, the device output interface and the response compressor are adapted to be implemented in a self-testing system for the device under test, wherein the self-testing system is coupled to receive the compressed stimulus waveform data from the stimulus interface and is coupled to provide the compressed response waveform data to the response interface.

26. In a test system for a device under test (DUT), an apparatus for transferring a stimulus waveform to the DUT from a host processor in the test system, the DUT having an input and an output, wherein the DUT responds to the stimulus waveform received at the input to produce a response waveform at the output, wherein the stimulus waveform is represented by a plurality of stimulus waveform samples in the host processor, comprising:

a stimulus compressor coupled to receive the plurality of stimulus waveform samples from the host processor and producing compressed stimulus waveform data;

a stimulus interface coupled to receive the compressed stimulus waveform data from the stimulus compressor;

a stimulus decompressor coupled to the stimulus interface, the stimulus decompressor retrieving the compressed stimulus waveform data from the stimulus interface and decompressing the compressed stimulus waveform data to form a decompressed stimulus waveform; and a device input interface coupled to the stimulus decompressor and to the input of the DUT, the device input interface providing the decompressed stimulus waveform as the stimulus waveform to the input of the DUT.

27. The apparatus of claim 26, wherein the stimulus waveform is an analog stimulus waveform, the device input interface further comprising:

a digital-to-analog converter coupled to receive the decompressed stimulus waveform and converting the decompressed stimulus waveform to an analog form to produce the analog stimulus waveform, wherein the analog stimulus waveform is provided as the stimulus waveform to the input of the DUT instead of the decompressed stimulus waveform.

28. The apparatus of claim 27, wherein the stimulus decompressor, the device input interface, including the digital-to-analog converter, and the device under test are adapted to be implemented in a self-testing system for the device under test, wherein the self-testing system is coupled to receive the compressed stimulus waveform data from the stimulus interface.

29. The apparatus of claim 26, wherein at least one of the stimulus compressor and the stimulus decompressor operates in accordance with a control parameter.

30. The apparatus of claim 26, wherein the stimulus compressor operates in one or more compression modes, including at least one of a lossless compression mode and a lossy compression mode.

31. The apparatus of claim 26, wherein the stimulus interface comprises a data storage device, including but not limited to at least one of a memory and a computer-readable medium.

32. The apparatus of claim 26, wherein the stimulus interface comprises a data transfer interface, including but not limited to at least one of a bus, a cable and a network.

33. The apparatus of claim 26, wherein the stimulus decompressor, the device input interface and the device under test are adapted to be implemented in a self-testing system for the device under test, wherein the self-testing system is coupled to receive the compressed stimulus waveform data from the stimulus interface.

* * * * *